(12) United States Patent  
Matsumoto et al.

(10) Patent No.: US 8,440,918 B2  
(45) Date of Patent: May 14, 2013

(54) ASSEMBLY OF CASE AND ELECTRONIC COMPONENTS AND COMBINATION OF THE ASSEMBLY AND EXTERNAL CONNECTORS

(75) Inventors: Kazurou Matsumoto, Tokyo (JP); Akira Nakasaka, Anjo (JP)

(73) Assignee: Denso Corporation, Kariya (JP)

( * ) Notice: Subject to any disclaimer, the term of this patent is extended or adjusted under 35 U.S.C. 154(b) by 184 days.

(21) Appl. No.: 13/025,583

(22) Filed: Feb. 11, 2011

(65) Prior Publication Data

US 2011/0198121 A1 Aug. 18, 2011

(30) Foreign Application Priority Data

Feb. 12, 2010 (JP) ................................. 2010-028625  
Jan. 11, 2011 (JP) ................................. 2011-003138

(51) Int. Cl.  
*H05K 5/00* (2006.01)

(52) U.S. Cl.  
USPC ................. 174/549; 174/55; 174/64; 174/58; 174/71 B; 174/88 B; 174/99 B; 174/550

(58) Field of Classification Search ................ 174/71 B, 174/88 B, 99 B, 129 B, 58, 64, 55, 520, 561, 174/70 B, 72 B, 559, 562; 361/611, 624; 248/906  
See application file for complete search history.

(56) References Cited

U.S. PATENT DOCUMENTS

| | | | |
|---|---|---|---|
| 5,387,049 A * | 2/1995 | Duckett ............................ | 404/6 |
| 5,486,979 A * | 1/1996 | Bowen et al. ................. | 361/640 |
| 5,493,085 A * | 2/1996 | Kolberg et al. ............. | 200/51 R |
| 5,971,337 A | 10/1999 | Furuya et al. | |
| 6,238,254 B1 * | 5/2001 | De Pourquoy et al. ....... | 439/813 |
| 6,785,139 B2 * | 8/2004 | Onizuka et al. ............... | 361/704 |
| 6,885,835 B2 * | 4/2005 | Seo ................................ | 399/88 |
| 7,112,741 B2 * | 9/2006 | Hechler ......................... | 174/50 |
| 7,538,448 B2 * | 5/2009 | Yoshida et al. ................ | 307/9.1 |

FOREIGN PATENT DOCUMENTS

| | | |
|---|---|---|
| JP | UM-H03-050766 | 5/1991 |
| JP | H10-037938 | 2/1998 |
| JP | 2009-219284 | 9/2009 |

OTHER PUBLICATIONS

Japanese Office Action dated Apr. 24, 2012, issued in corresponding Japanese Application No. 2011-003138 with English translation.

\* cited by examiner

*Primary Examiner* — Boris L. Chervinsky  
*Assistant Examiner* — Pete Lee  
(74) *Attorney, Agent, or Firm* — Nixon & Vanderhye PC

(57) ABSTRACT

An assembly includes at least one electronic component, a bus bar electrically connected to the electronic component and having a connection portion, a case receiving both the electronic component and the bus bar and having first and second openings, and a drop prevention member having a drop prevention wall. The connection portion of the bus bar is to be connected with a terminal of an external connector by engaging a first engaging member to be placed inside the case through the first opening and a second engaging member provided in the external connector. In the assembly, there is defined, by the drop prevention wall, the connection portion of the bus bar, and part of the external connector, a confinement space for confining the first engaging member and thereby preventing it from dropping outside the confinement space during establishment of the engagement between the first and second engaging members.

16 Claims, 29 Drawing Sheets

ASSEMBLY OF CASE AND ELECTRONIC COMPONENTS AND COMBINATION OF THE ASSEMBLY AND EXTERNAL CONNECTORS

CROSS-REFERENCE TO RELATED APPLICATIONS

This application is based on and claims priority from Japanese Patent Applications No. 2010-28625 filed on Feb. 12, 2010 and No. 2011-3138 filed on Jan. 11, 2011, the contents of which are hereby incorporated by reference in their entireties into this application.

BACKGROUND OF THE INVENTION

1. Technical Field of the Invention

The present invention relates to an assembly of a case and electronic components, and to a combination of the assembly and external connectors.

2. Description of the Related Art

Conventionally, as shown in FIG. 30, there is known an assembly 90 that includes an electronic component 96, a bus bar 92 connected to the electronic component 96, and a case 91 that receives therein both the electronic component 96 and the bus bar 92. The assembly 90 is configured so as to allow the bus bar 92 to be connected with a terminal 95a of an external connector 95 by tightening a bolt 93 within the case 91 (see, for example, Japanese Patent Application Publication No. 2009-219284).

More specifically, the case 91 has formed therein both an opening 94 through which the bolt 93 is to be positioned inside the case 91 and an opening 97 through which the terminal 95a of the external connector 95 is to be inserted into the case 91. The opening directions (or facing directions) of the openings 94 and 97 are perpendicular to each other. In addition, the bus bar 92 has a through-hole 92a formed therein, while the external connector 95 has a nut 95b embedded therein.

In connecting the terminal 95a of the external connector 95 to the bus bar 92, the terminal 95a is first inserted into the case 91 through the opening 97, thereby bringing the nut 95b embedded in the external connector 95 into alignment with the through-hole 92a of the bus bar 92. Then, the bolt 93 is placed inside the case 91 through the opening 94, and tightened into the nut 95b through the through-hole 92a of the bus bar 92. Consequently, the bus bar 92 and the terminal 95a of the external connector 95 are fastened together by the engagement between the bolt 93 and the nut 95b.

Moreover, the external connector 95 includes a resin-made body portion 95d and a connection portion 95c for making connection with an external device (not shown). The connection portion 95c has formed therein an internal space to which an end portion 95e of the terminal 95a is exposed. The end portion 95e is to be connected to an electric wire (not shown) extending from the external device, thereby electrically connecting the electric component 96 to the external device.

However, with the above configuration of the conventional assembly 90, during the connecting of the terminal 95a of the external connector 95 to the bus bar 92, the bolt 93 may be accidentally dropped into the case 91. In this case, if the bolt 93 drops down to a bottom portion 91a of the case 91, it will be difficult to take out the bolt 93.

In addition, it may be possible to take out the bolt 93 from the case 91 by turning the case 91 upside down and thereby causing the bolt 93 to fall out through the opening 94 of the case 91. However, this process is time-consuming, thus lowering the productivity. Moreover, during this process, the bolt 93 may collide with and thereby damage the electronic component 96.

SUMMARY OF THE INVENTION

According to one aspect of the present invention, there is provided an assembly which includes at least one electronic component, a bus bar electrically connected to the at least one electronic component and having a connection portion, and a case that receives therein both the at least one electronic component and the bus bar. The assembly is configured so as to allow the connection portion of the bus bar to be connected with a terminal of an external connector by engaging a first engaging member with a second engaging member within the case. The case has first and second walls and first and second openings that are formed respectively through the first and second walls. The first opening of the case opens in a thickness-wise direction of the connection portion of the bus bar. The first engaging member is to be placed inside the case through the first opening of the case. The second engaging member is provided in the external connector and to be placed inside the case along with the terminal through the second opening of the case. The assembly further includes a drop prevention member interposed between the first wall of the case and the connection portion of the bus bar in the thickness-wise direction of the connection portion. The drop prevention member has a drop prevention wall and a through-hole that is defined by the drop prevention wall and aligned with the first opening of the case in the thickness-wise direction of the connection portion of the bus bar. The connection portion of the bus bar is positioned relative to the case and the drop prevention member so as to be viewable from outside of the case through both the first opening of the case and the through-hole of the drop prevention member. The assembly is further configured so that when the terminal of the external connector is inserted in the case through the second opening of the case, there is defined a confinement space by the drop prevention wall, the connection portion of the bus bar, and part of the external connector.

With the above configuration of the assembly, if the first engaging member is accidentally dropped during the connecting of the connection portion of the bus bar to the terminal of the external connector (i.e., during establishment of the engagement between the first and second engaging members), it is possible to confine the first engaging member within the confinement space and thereby prevent the first engaging member from dropping outside the confinement space into the interior of the case. As a result, the first engaging member can be easily picked up, thereby making it possible to immediately resume the connecting process. In addition, it is also possible to prevent the at least one electronic component from being hit and thereby damaged by the first engaging member.

According to another aspect of the present invention, there is provided a combination of an assembly and an external connector. The assembly includes at least one electronic component, a bus bar electrically connected to the at least one electronic component and having a connection portion, and a case that receives therein both the at least one electronic component and the bus bar. The external connector includes a terminal. The case of the assembly has first and second walls and first and second openings that are formed respectively through the first and second walls. The first opening of the case opens in a thickness-wise direction of the connection portion of the bus bar. The connection portion of the bus bar is connected with the terminal of the external connector by engagement between first and second engaging members. The first engaging member has been placed inside the case through the first opening of the case. The second engaging member is provided in the external connector and has been placed inside the case along with the terminal through the second opening of the case. The assembly further includes a drop prevention member interposed between the first wall of the case and the connection portion of the bus bar in the thickness-wise direction of the connection portion. The drop prevention member has a drop prevention wall and a through-hole that is defined by the drop prevention wall and aligned with the first opening of the case in the thickness-wise direction of the connection portion of the bus bar. The connection portion of the bus bar is positioned relative to the case and the drop prevention member so as to be viewable from outside of the case through both the first opening of the case and the through-hole of the drop prevention member. The drop prevention wall, the connection portion of the bus bar, and part of the external connector together define a confinement space for confining the first engaging member and thereby preventing the first engaging member from dropping outside the confinement space during establishment of the engagement between the first and second engaging members.

With the above configuration, if the first engaging member is accidentally dropped during the connecting of the connection portion of the bus bar to the terminal of the external connector (i.e., during establishment of the engagement between the first and second engaging members), it will be confined within the confinement space and thus prevented from dropping outside the confinement space into the interior of the case. Consequently, the at least one electronic component is prevented from being hit and thereby damaged by the first engaging member. As a result, high reliability of the at least one electronic component is ensured.

BRIEF DESCRIPTION OF THE DRAWINGS

The present invention will be understood more fully from the detailed description given hereinafter and from the accompanying drawings of preferred embodiments of the invention, which, however, should not be taken to limit the invention to the specific embodiments but are for the purpose of explanation and understanding only.

In the accompanying drawings.

DESCRIPTION OF PREFERRED EMBODIMENTS

Figure 1:
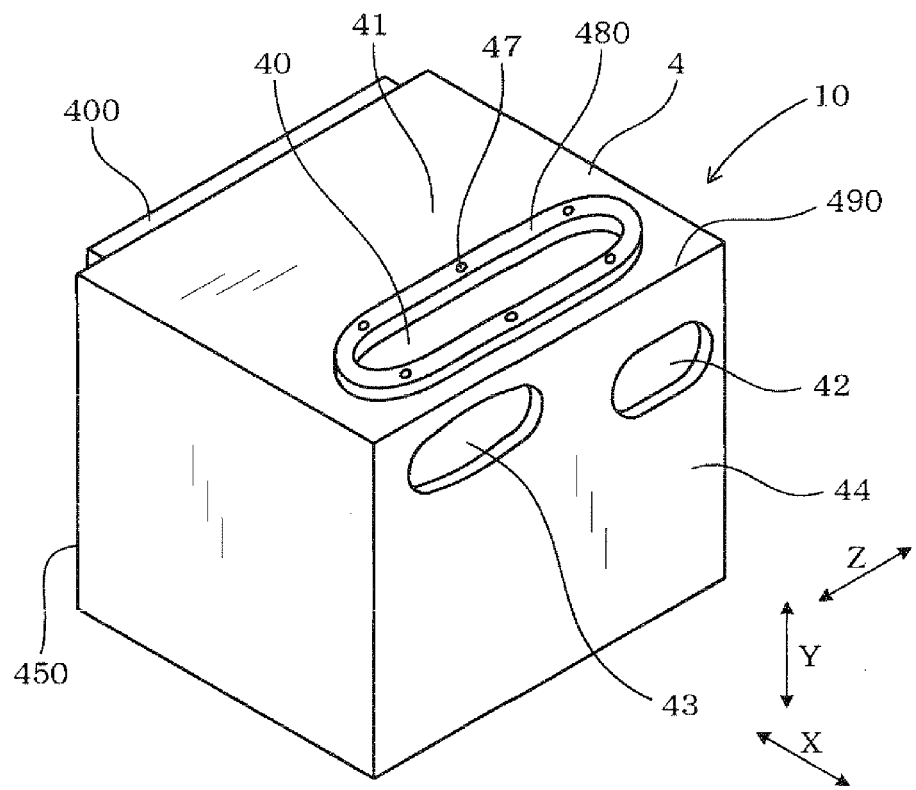
FIG. 1 is a perspective view of an assembly according to the first embodiment of the invention before being connected with first and second external connectors.

Preferred embodiments of the present invention will be described hereinafter with reference to FIGS. 1-29. It should be noted that for the sake of clarity and understanding, identical components having identical functions in different embodiments of the invention have been marked, where possible, with the same reference numerals in each of the figures and that for the sake of avoiding redundancy, descriptions of the identical components will not be repeated.

First Embodiment

Referring to FIGS. 1, 3-4, and 6-7, an assembly 10 according to the first embodiment of the invention includes electronic components 11, first bus bars 2 electrically connected to the electronic components 11 and each having a connection portion 21, and a case 4 that receives therein the electronic components 11 and the first bus bars 2.

The assembly 10 is configured to be connected with both a first external connector 3 and a second external connector 13 to form a combination 1 of the assembly 10 and the first and second external connectors 3, as shown in FIGS. 2-4 and 12.

Specifically, in the present embodiment, the assembly 10 is configured so as to allow each of the connection portions 21 of the first bus bars 2 to be connected with a corresponding one of terminals 30 of the first external connector 3 by engaging a pair of first and second engaging members 5 and 34 within the case 4.

In addition, in the present embodiment, each of the first engaging members 5 is implemented by a bolt 5, while each of the second engaging members 34 is implemented by a nut 34 embedded in the first external connector 3. Each pair of the first and second engaging members 5 and 34 are engaged with each other by tightening the first engaging member (i.e., bolt) 5 into the second engaging member (i.e., nut) 34.

The case 4 has an opening 42 through which the terminals 30 of the first external connector 3 are to be inserted into the case 4 and an opening 40 through which the bolts 5 are to be placed inside the case 4. In addition, the opening 40 is formed through a top wall 41 of the case 4 so as to open in the thicknesswise direction of the connection portions 21 of the first bus bars 2.

Figure 3:
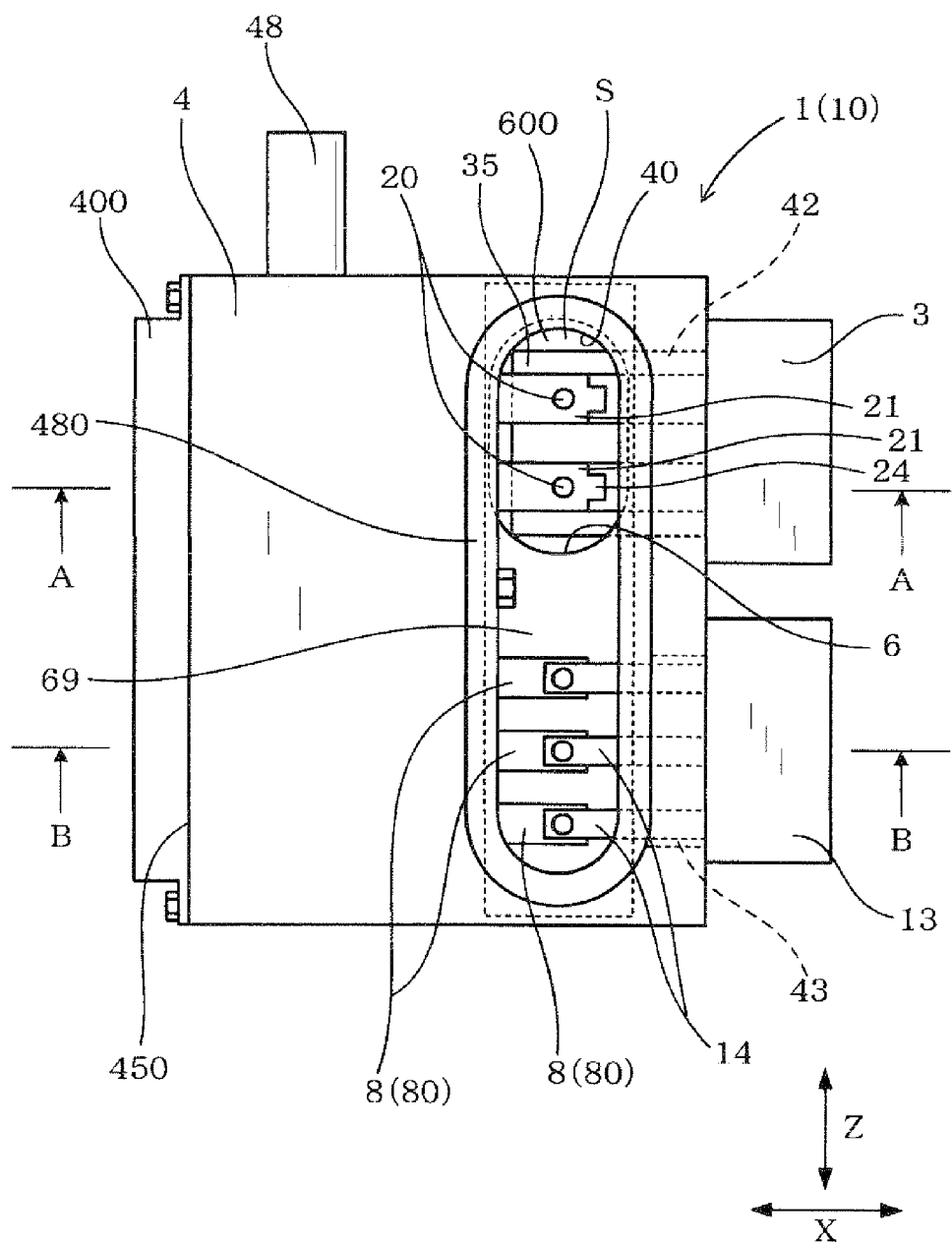
FIG. 3 is a top view of the assembly according to the first embodiment, wherein terminals of the first and second external connectors are inserted in a case of the assembly but not connected with first and second bus bars of the assembly.

The assembly 10 according to the present embodiment further includes a drop prevention member 69 that is interposed between the top wall 41 of the case 4 and the connection portions 21 of the first bus bars 2. As shown in FIG. 3, the drop prevention member 69 has a drop prevention wall 6 that surrounds, when viewed along the insertion direction of the bolts 5 (i.e., along the Y direction indicated in FIG. 1), the connection portions 21 of the first bus bars 2. The drop prevention member 69 also has a through-hole 600 which is defined by the inner circumferential surface of the drop prevention wall 6 so as to extend in the insertion direction of the bolts 5.

Figure 7:
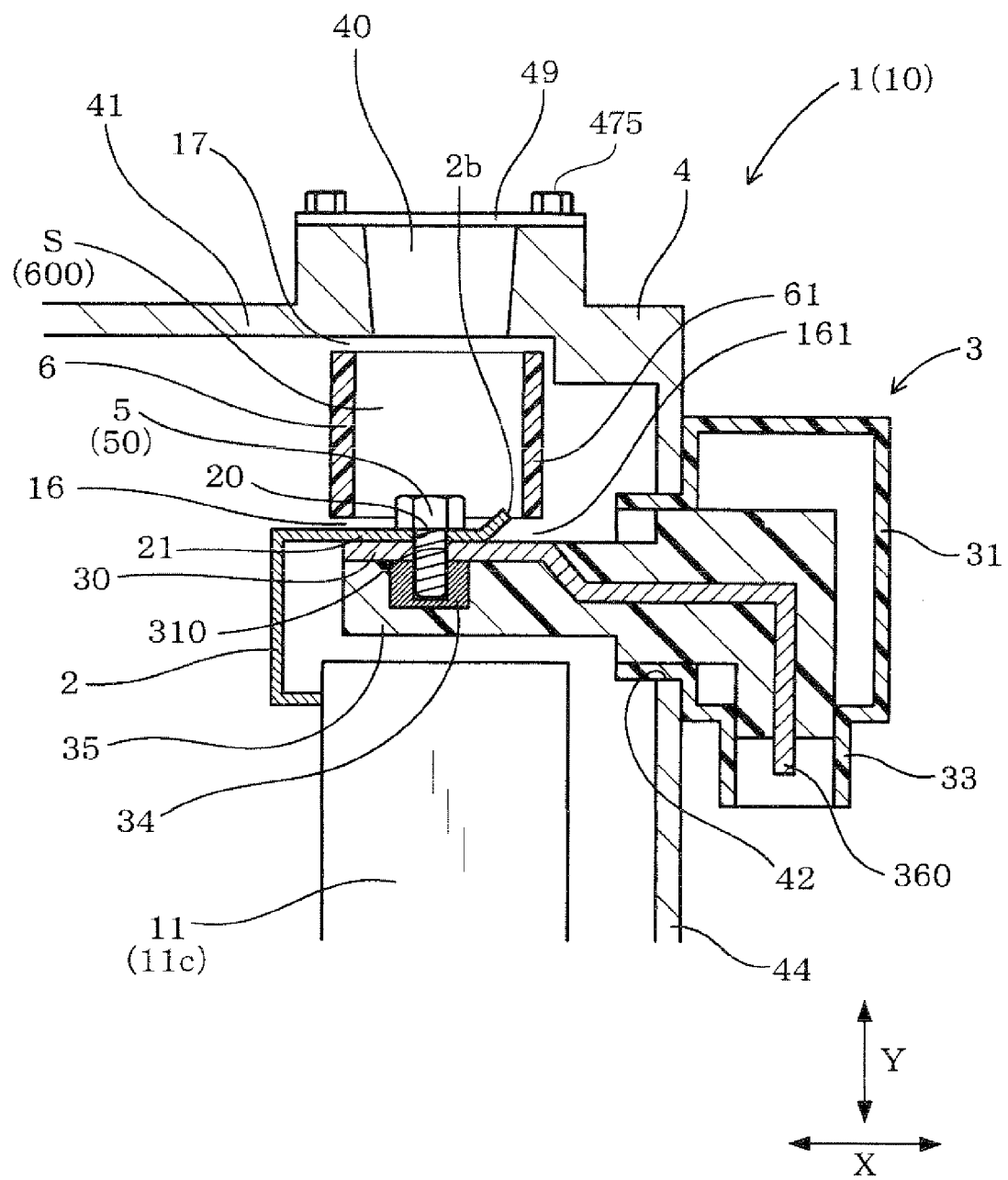
FIG. 7 is an enlarged partially cross-sectional view showing part of the assembly according to the first embodiment after connecting the terminals of the first external connector to the first bus bars of the assembly.

Moreover, referring to FIGS. 3 and 7, after inserting the terminals 30 of the first external connector 3 into the case 4 through the opening 42, the drop prevention wall 6, the connection portions 21 of the first bus bars 2, and part (i.e., a terminal seat portion 35) of the first external connector 3 together define a confinement space S within which the bolts 5 are to be confined and thus prevented from dropping outside the confinement space S.

As shown in FIGS. 1 and 3, the case 4 has the shape of a substantially rectangular box. In one of the six faces of the case 4, there is formed an opening 450 through which the electronic components 11 are assembled into the case 4. Further, after assembling the electronic components 11 into the case 4, a lid 400 is fixed to the case 4 to close the opening 450. The case 4 is made of a metal such as aluminum. Through a front wall 44 of the case 4, which faces the opening 450, there are formed both the above-described opening 42 and an opening 43 through which the second external connector 13 is to be inserted into the case 4.

The opening 40 of the case 4 is formed close to the corner 490 between the top wall 41 and the front wall 44. The opening 40 extends more in a Z direction, which is perpendicular to both the insertion direction X of the first external connector 3 and the insertion direction Y of the bolts 5, than in the X direction. In other words, the opening 40 has its length in the Z direction and its width in the X direction. Further, when both the first and second external connectors 3 and 13 are inserted into the case 4 respectively through the openings 42 and 43 and arranged therein at predetermined positions, both an end portion of the first external connector 3 and an end portion of the second external connector 13 are viewable from outside of the case 4 through the opening 40. In addition, around the opening 40, there is formed a rim portion 480 that protrudes in the Y direction from the top wall 41 of the case 4. The rim portion 480 has formed therein tapped holes 47 for mounting a later-described lid 49 (shown in FIG. 7) to the case 4.

The opening 43 for inserting the second external connector 13 into the case 4 is formed closer to the corner 490 between the top wall 41 and the front wall 44 than the opening 42 for inserting the first external connector 3 into the case 4 is. Moreover, each of the openings 43, 42, and 40 has both the ends thereof in the Z direction shaped in a substantially semi-circle.

Figure 4:
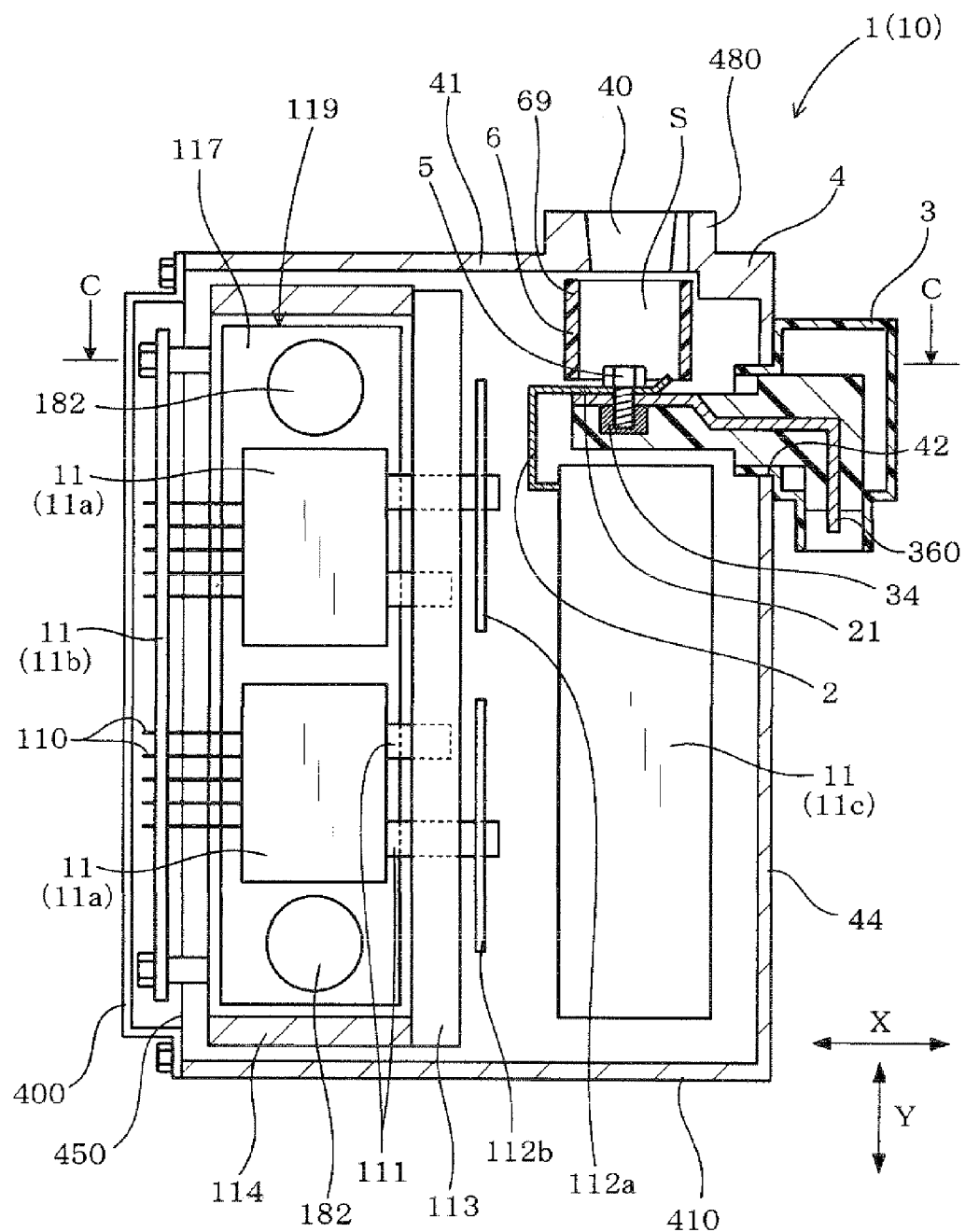
FIG. 4 is a partially cross-sectional view taken along the line A-A in FIG. 3.

Referring to FIG. 4, the electronic components 11 received in the case 4 include semiconductor modules 11a each having switching elements (not shown) built therein, a control circuit board 11b connected with the semiconductor modules 11a, and a capacitor 11c. The electronic components 11a-11c together form an electric power conversion circuit that performs conversion between DC power and AC power. In other words, the assembly 10 is configured to be used as an electric power converter.

The capacitor 11c is located in the Y direction further from the opening 40 than the opening 42 is. Further, the capacitor 11c is arranged along the front wall 44 of the case 4 so as to face the inner surface of the front wall 44 with a predetermined gap formed therebetween. Moreover, after inserting the first external connector 3 into the case 4 through the opening 42, the capacitor 11c is interposed between the terminal seat portion 35 of the first external connector 3 and the bottom wall 410 of the case 4 in the Y direction.

The semiconductor modules 11a and the control circuit board 11b are located in the X direction closer to the opening 450 of the case 4 than the capacitor 11c, the terminal seat portion 35 of the first external connector 3, and the drop prevention member 69 are.

Figure 5:
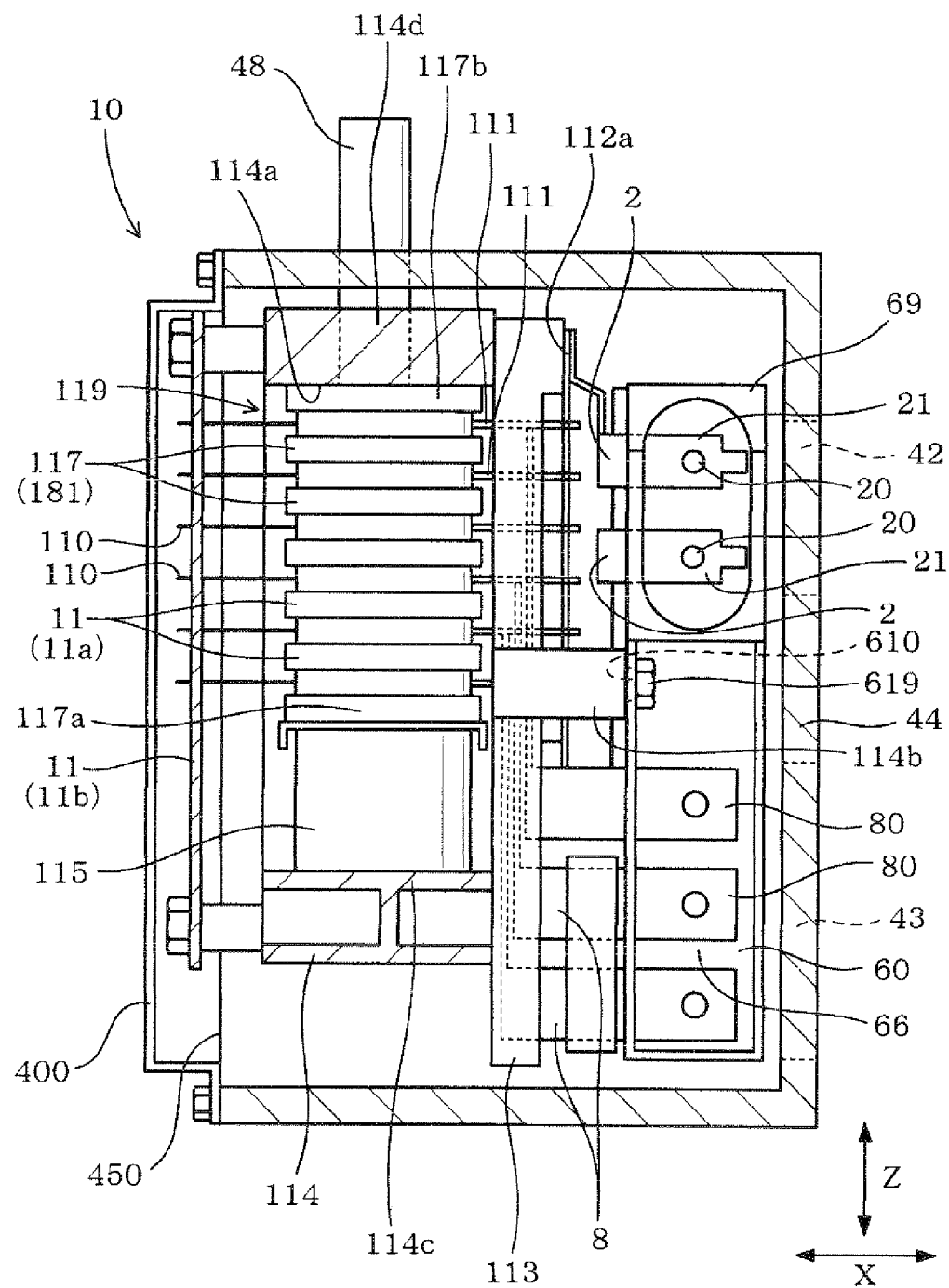
FIG. 5 is a partially cross-sectional view taken along the line C-C in FIG. 4.
Figure 6:
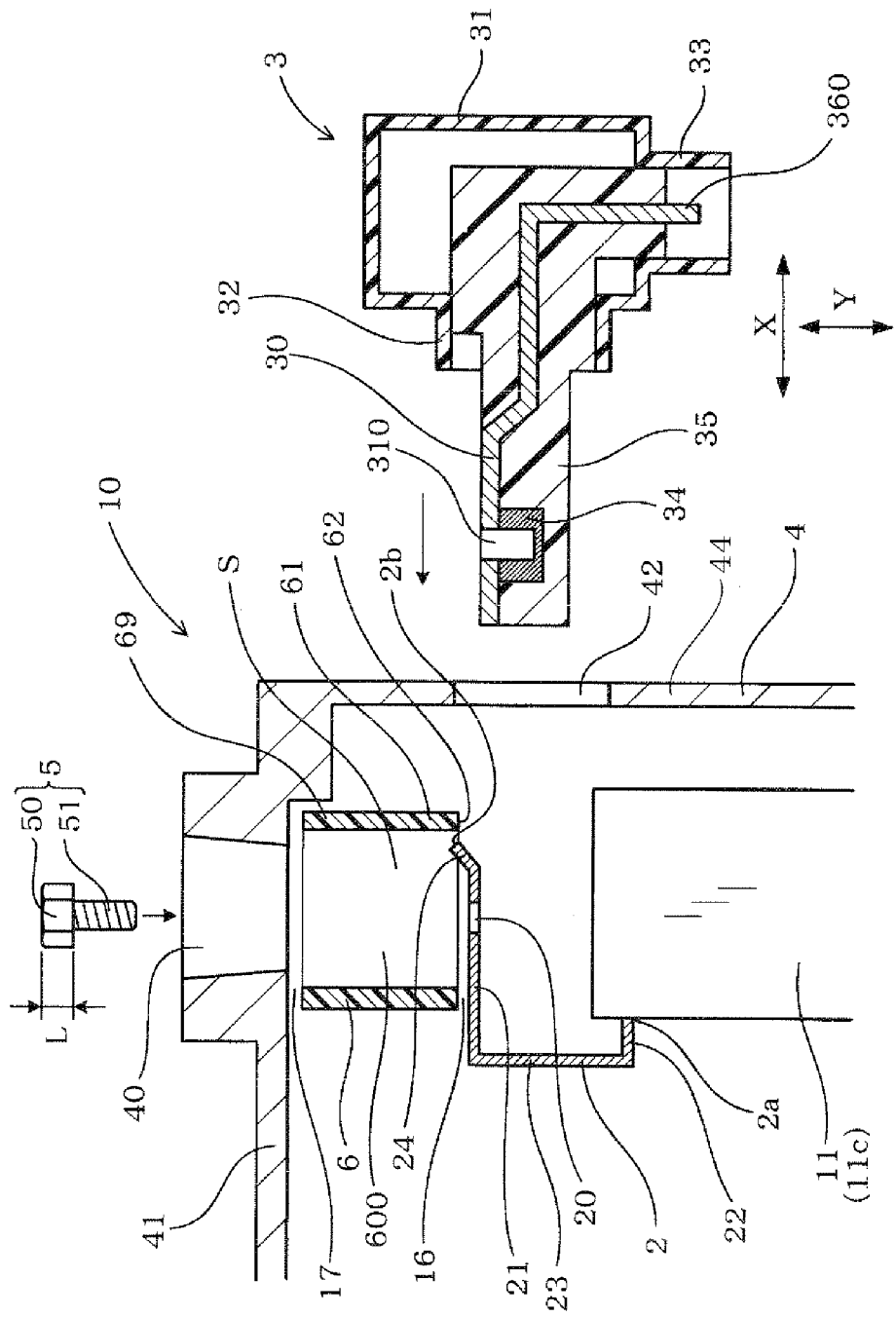
FIG. 6 is an enlarged partially cross-sectional view showing part of the assembly according to the first embodiment before connecting the terminals of the first external connector to the first bus bars of the assembly.

Referring to FIGS. 5 and 6, in the present embodiment, the number of the first bus bars 2 is equal to 2. Each of the first bus bars 2 is connected to a capacitor element (not shown) of the capacitor 11.

More specifically, as shown in FIG. 6, each of the first bus bars 2 includes, in addition to the connection portion 21, a proximal portion 22, an intermediate portion 23, and a distal portion 24. The proximal portion 22 extends in the X direction from the capacitor 11 toward the opening 450 of the case 4. The intermediate portion 23 extends in the Y direction between the proximal portion 22 and the connection portion 21. The connection portion 21 extends in the X direction from the intermediate portion 23 toward the opening 42 of the case 4. The distal portion 24 extends from the connection portion 21 in a direction that deviates from the X direction toward the opening 40 of the case 4. Part of the distal portion 24 is located inside the drop prevention wall 6. In addition, the connection portion 21 has a through-hole 20 that is formed, at a predetermined position viewable from outside of the case 4 through the opening 40, to penetrate through the connection portion 21 in the thickness-wise direction thereof (i.e., in the Y direction).

With the above configuration of the first bus bars 2, there is formed, between the capacitor 11c and the connection portions 21 of the first bus bars 2, an open space that opens toward the opening 42 of the case 4. Consequently, the first external connector 3 can be inserted into the case 4 through the opening 42 so as to have its terminals 30 and terminal seat portion 35 located within the open space.

Figure 2:
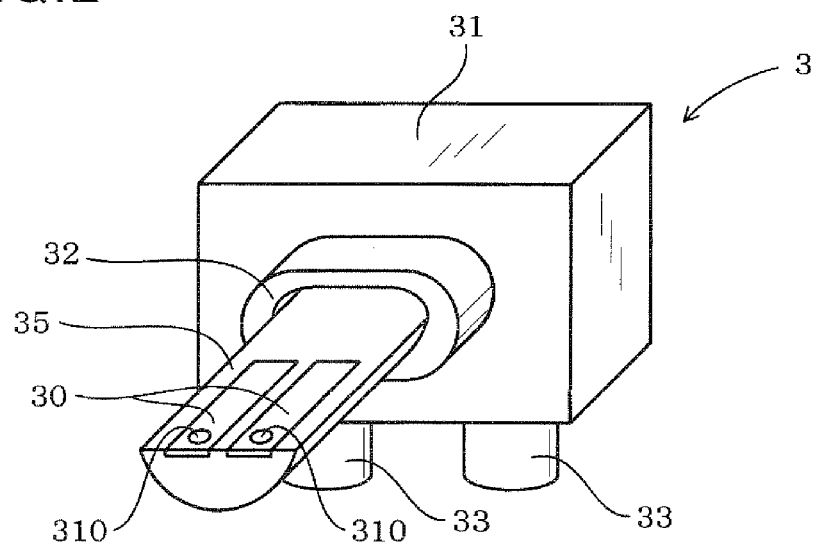
FIG. 2 is a perspective view of the first external connector according to the first embodiment.

Referring to FIGS. 2 and 6, the first external connector 3 includes a body portion 31, a protruding portion 32, and the terminal seat portion 35. The body portion 31 has a substantially rectangular solid shape with a hollow space formed therein. The protruding portion 32 protrudes from one face of the body portion 31 and has the shape of a flattened tube so as to fit into the opening 42 of the case 4. The terminal seat portion 35 is located radially inside the protruding portion 32 and protrudes further from the protruding portion 32 in the same direction as the protruding portion 32.

Moreover, the first external connector 3 further includes a pair of connection portions 33 that protrude from another face of the body portion 31 in a direction perpendicular to the protruding direction of the protruding portion 32 and terminal seat portion 35. In addition, all of the body portion 31, protruding portion 32, terminal seat portion 35, and connection portions 33 of the first external connector 3 are made of, for example, a resin.

The terminal seat portion 35 holds a pair of terminals 30 that extend from the inside of the body portion 31 to the distal end of the terminal seat portion 35. More specifically, the terminal seat portion 35 has a flat surface that extends parallel to the protruding direction of the terminal seat portion 35 and has one end coinciding with the distal end of the terminal seat portion 35. Each of the terminals 30 is partially embedded in the terminal seat portion 35 so as to be exposed on the flat surface of the terminal seat portion 35. Moreover, each of the terminals 30 has a through-hole 310 that is formed to penetrate through the exposed portion of the terminal 30 in the thickness-wise direction (i.e., in the Y direction). Furthermore, the terminal seat portion 35 has a pair of nuts (i.e., the second engaging members) 34 embedded therein. Each of the nuts 34 is located so as to align with a corresponding one of the through-holes 310 of the terminals 30 in the Y direction.

Each of the terminals 30 is bent from the X direction toward the corresponding connection portion 33 so as to have an end portion 360 exposed to the internal space of the corresponding connection portion 33. The end portion 360 is to be connected to an electric wire (not shown) extending from an external device (not shown).

In addition, when the terminals 30 are inserted in the case 4 with the protruding portion 32 of the first external connector 3 fitted in the opening 42 of the case 4, the drop prevention member 69 is interposed between the terminals 30 and the opening 40 of the case 4 in the Y direction.

Figure 9:
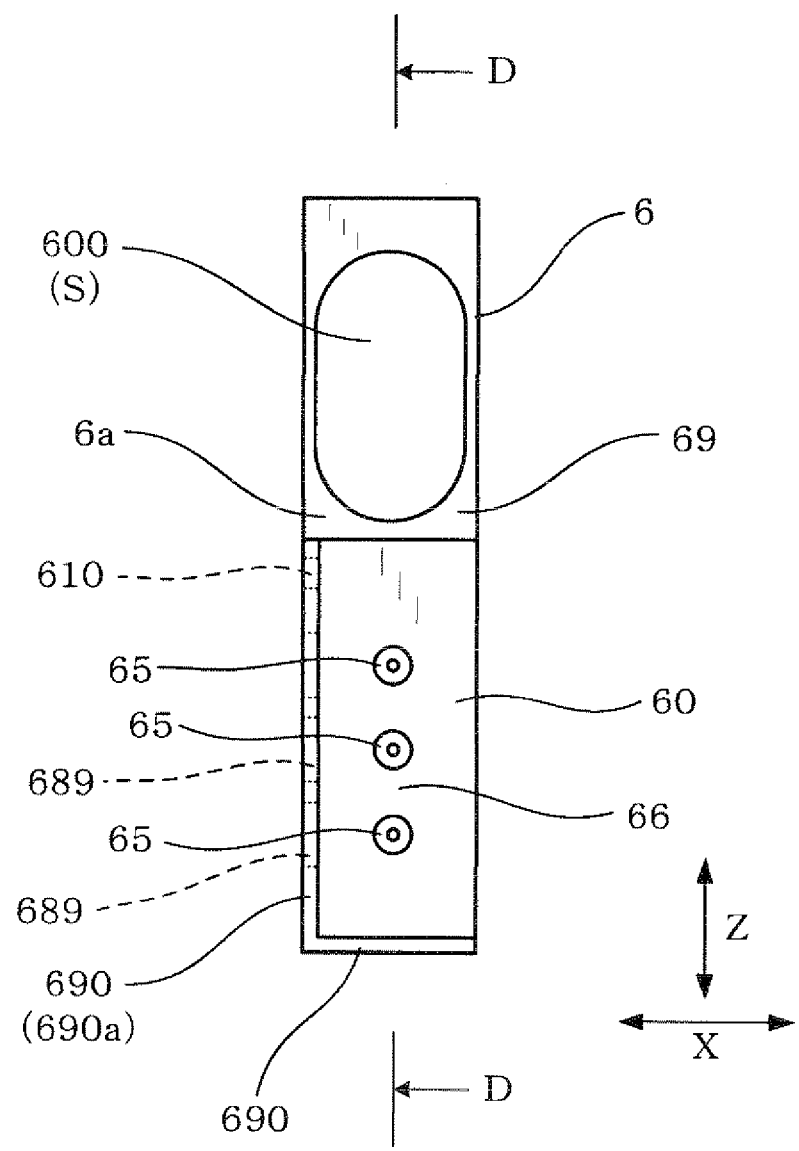
FIG. 9 is a top view of a drop prevention member according to the first embodiment.

Referring now to FIG. 9, the drop prevention member 69 has a substantially rectangular shape when viewed from the opening 40 of the case 4 in the Y direction (i.e., in the direction perpendicular to the paper surface of FIG. 9). Moreover, the drop prevention member 69 has the through-hole 600 that penetrates through the drop prevention member 69 in the Y direction. The through-hole 600 is surrounded by the inner circumferential surface of the drop prevention wall 6 and has both ends thereof in the Z direction shaped in a substantially semicircle.

Moreover, as shown in FIG. 7, after inserting the terminals 30 and terminal seat portion 35 of the first external connector 3 into the case 4 through the opening 42 and thereby bringing the terminals 30 into contact with those surfaces of the connection portions 21 of the first bus bars 2 which face the capacitor 11, the confinement space S is formed which is surrounded by the drop prevention wall 6, the connection portions 21 of the first bus bars 2, and the terminal seat portion 35 of the first external connector 3. During the connecting of the connection portions 21 of the first bus bars 2 to the corresponding terminals 30 of the first external connector 3 (i.e., during establishment of the engagement between the bolts 5 and the nuts 34), the bolts 5 are confined within the confinement space S and thus prevented from dropping outside the confinement space S.

In the present embodiment, as shown in FIG. 6, each of the bolts 5 is configured to include a head portion 50 with a length L in the axial direction of the bolt 5 and a shaft portion 51 that is male-threaded.

Figure 8:
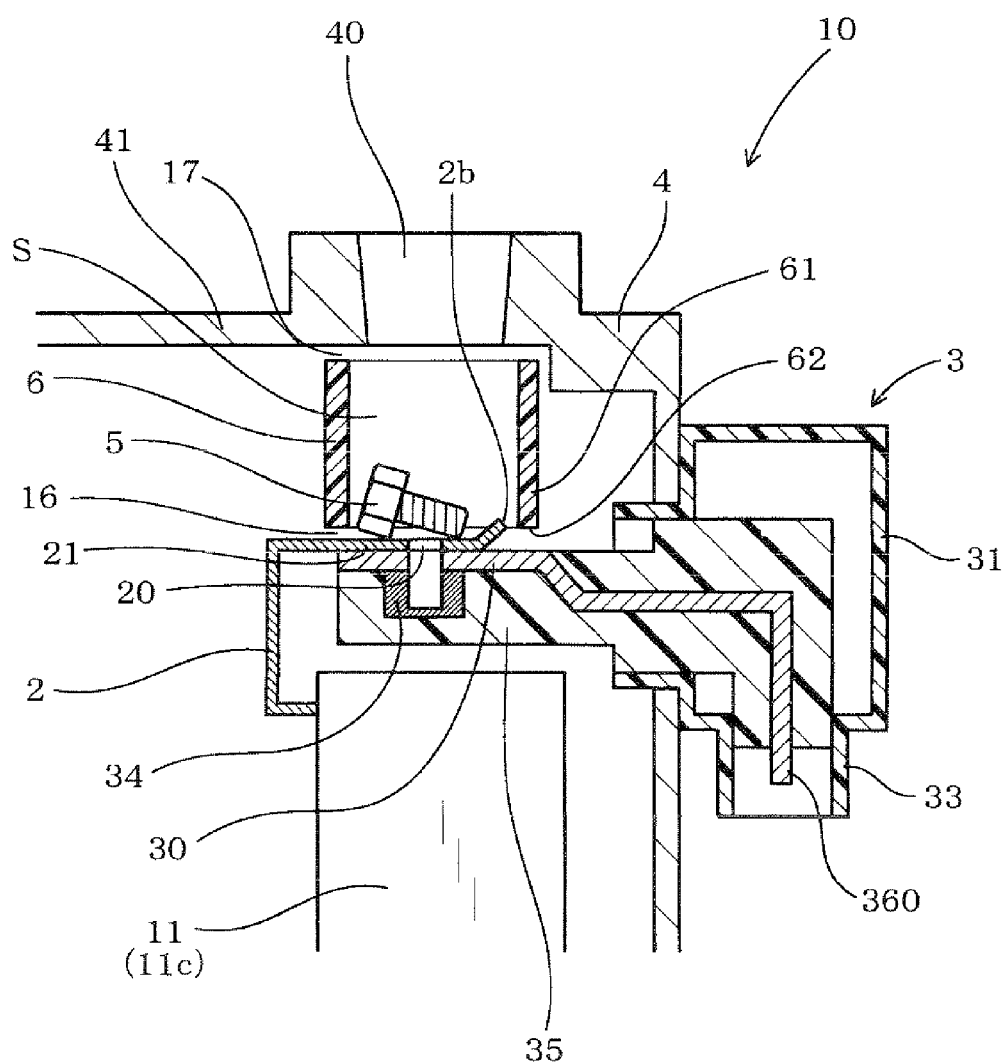
FIG. 8 is a schematic view illustrating the dropping of a bolt by accident during the connecting of the terminals of the first external connector to the first bus bars of the assembly.

Further, as shown in FIGS. 7 and 8, both a clearance 16 between the drop prevention wall 6 and the first bus bars 2 and a clearance 161 between the drop prevention wall 6 and the first external connector 3 in the Y direction are set to be less than the length L of the head portions 50 of the bolts 5.

Furthermore, a clearance 17 between the inner surface of the top wall 41 of the case 4 and the drop prevention wall 6 is also set to be less than the length L of the head portions 50 of the bolts 5.

Figure 13:
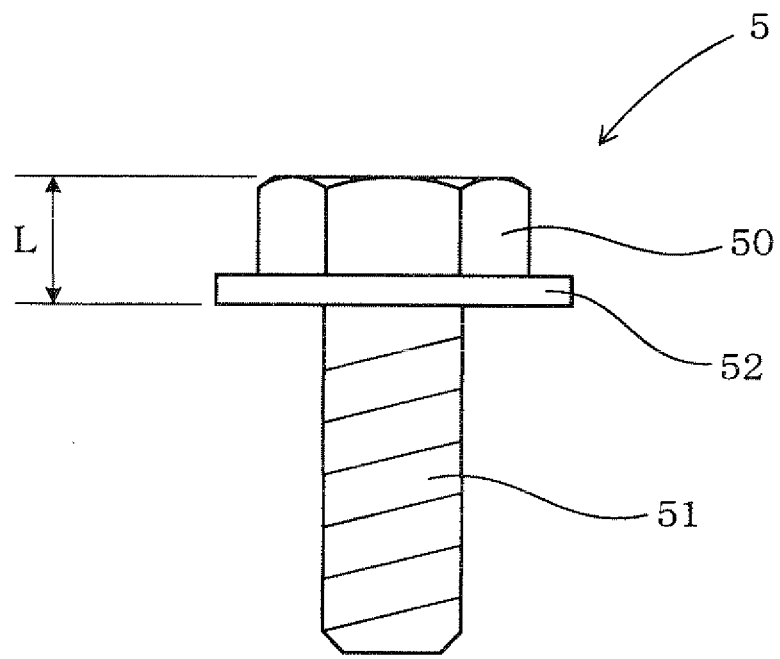
FIG. 13 is a side view of a bolt according to a modification of the first embodiment.

In addition, each of the bolts 5 may also be configured to further include a flange portion 52 between the head portion 50 and the shaft portion 51, as shown in FIG. 13. In this case, for each of the bolts 5, the dimension L represents the sum of lengths of the head and flange portions 50 and 52. However, counting the flange portion 52 as a part of the head portion 50, the dimension L still represents the length of the head portion 50.

Moreover, it is also possible to set the clearance 17 between the inner surface of the top wall 41 of the case 4 and the drop prevention wall 6 to be less than the inscribed circle diameter of the head portions 50 of the bolts 5. However, to more reliably prevent the bolts 5 from dropping outside the confinement space S through the clearance 17, it is preferable to set the clearance 17 to be less than the length L of the head portions 50 of the bolts 5 as in the present embodiment.

Figure 10:
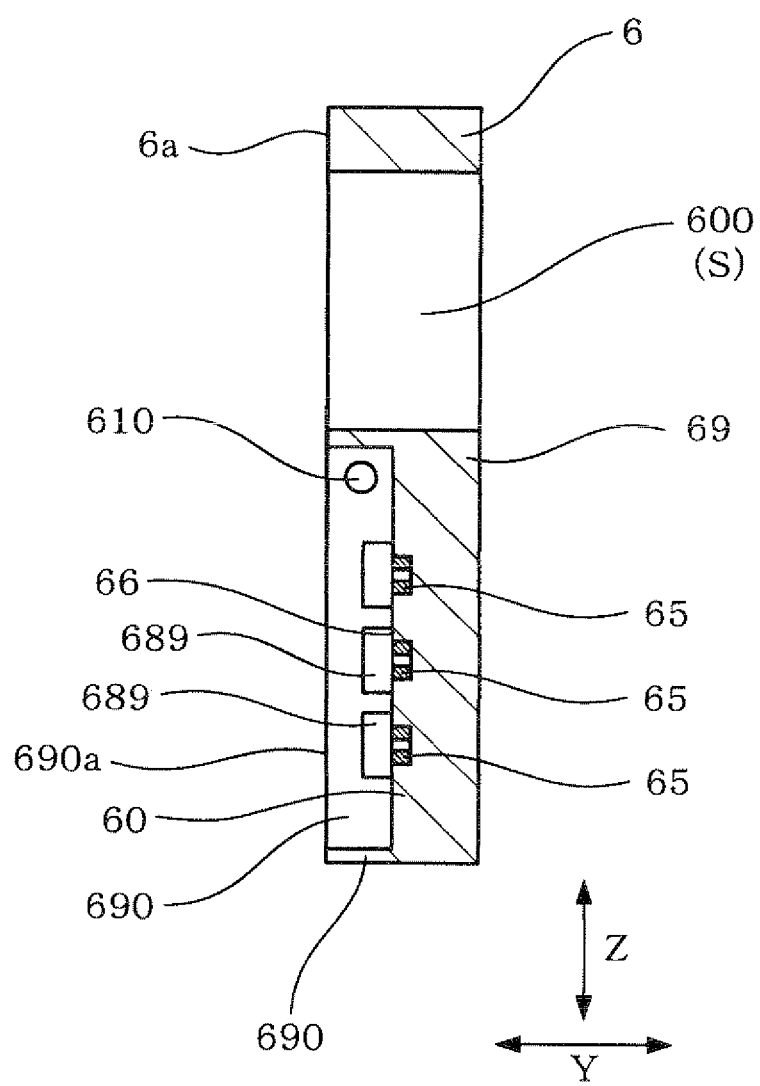
FIG. 10 is a partially cross-sectional view taken along the line D-D in FIG. 9.

Referring to FIGS. 9 and 10, in the present embodiment, the drop prevention member 69 is integrally formed with a terminal block 60 into one piece. The terminal block 60 has a mounting surface 66 on which connection portions 80 of second bus bars 8 (shown in FIG. 12) are to be mounted.

More specifically, the mounting surface 66 extends perpendicular to the penetrating direction of the through-hole 600 of the drop prevention member 69 (i.e., perpendicular to the Y direction). On the mounting surface 66, each of the connection portions 80 of the second bus bars 8 is to be connected with a corresponding one of terminals 14 of the second external connector 13 by engaging a pair of third and fourth engaging members 15 and 65 within the case 4.

In the present embodiment, each of the third engaging members 15 is implemented by a bolt 15. On the other hand, each of the fourth engaging members 65 is implemented by a nut 65 that is embedded in the terminal block 60 so as to open on the mounting surface 66. Each pair of the third and fourth engaging members 15 and 65 are engaged with each other by tightening the third engaging member (i.e., bolt 15) into the fourth engaging member (i.e., nut 65).

Moreover, in the present embodiment, both the number of the second bus bars 8 and the number of the terminals 14 are equal to 3. Accordingly, for connecting the three pairs of the second bus bars 8 and the terminals 14, the terminal block 60 has a total of three nuts 65 embedded therein.

The terminal block 60 has a mounting wall 690 that is formed at both the electronic components 11-side end (i.e., the left end in FIG. 9) of the mounting surface 66 in the X direction and the non-drop prevention member 69-side end (i.e., the lower end in FIG. 9) of the mounting surface 66 in the Z direction so as to extend in the Y direction (i.e., in the direction perpendicular to the paper surface of FIG. 9). In addition, as shown in FIG. 10, an end surface 690*a* of the mounting wall 690 in the Y direction is flush with an end surface 6*a* of the drop prevention wall 6 in the Y direction.

The mounting wall 690 has three through-holes 689 through which the connection portions 80 of the second bus bars 8 are to be respectively inserted and a fixing through-hole 610 through which a bolt 619 (shown in FIG. 5) is to be passed for fixing the terminal block 60 and the drop prevention member 69. All of the through-holes 689 and the fixing through-hole 610 are formed to penetrate through the mounting wall 69 in the X direction.

In addition, in the present embodiment, the terminal block 60 and the drop prevention member 69 are one-piece molded using an insulative resin.

Referring to FIGS. 4 and 5, the three second bus bars 8 are connected to the semiconductor modules 11*a* arranged in the case 4. The semiconductor modules 11*a* are alternately stacked with cooling pipes 117 in the Z direction to form a stacked body 119. More specifically, between each adjacent pair of the cooling pipes 117, there are interposed two semiconductor modules 11*a* that align with each other in the Y direction. Each of the cooling pipes 117 has a coolant passage 181 formed therein. The stacked body 119 is arranged within a frame 114 that has a substantially rectangular cross section perpendicular to the X direction. Moreover, there is interposed a spring member 115 between the one (i.e., 117*a*) of the cooling pipes 117 which is located at the terminal block 60-side end of the stacked body 119 in the Z direction and a side wall 114*c* of the frame 114. Consequently, by the elastic force of the spring member 115, the stacked body 119 is pressed on the inner surface 114*a* of a side wall 114*d* of the frame 114; the side wall 114*d* is opposite to the side wall 114*c* in the Z direction. As a result, the stacked body 119 is compressed against the frame 114, and thus retained in the frame 114 keeping contact pressure between the semiconductor modules 11*a* and the cooling pipes 117.

On both sides of the stacked body 119 in the Y direction, there are respectively arranged a pair of connecting pipes 182. Each of the cooling pipes 182 connects all the cooling pipes 117. Moreover, a pair of inlet and outlet pipes 48 are mounted to the one (i.e., 117*b*) of the cooling pipes 117 which is located at the drop prevention member 69-side end of the stacked body 119 in the Z direction. Both the inlet and outlet pipes 48 protrude outside the case 4. In operation, coolant is introduced into the cooling pipe 117*b* via the inlet 48, distributed by the connecting pipes 182 to flow through each of the cooling pipes 117, and discharged out of the cooling pipe 117*b* via the outlet pipe 48. Consequently, the semiconductor modules 11*a* are cooled by the coolant flowing through the cooling pipes 117.

In addition, as described above, in the present embodiment, the spring member 115 is interposed between the cooling pipe 117*a* of the stacked body 119 and the side wall 114*c* of the frame 114 in the Z direction. However, it is also possible to interpose the spring member 115 between the cooling pipe 117*b* of the stacked body 119 and the side wall 114*d* of the frame 114. In this case, the stacked body 119 will be pressed on the side wall 114*c* of the frame 114 by the elastic force of the spring member 115. Moreover, the spring member 115 will be interposed between the inlet and outlet pipes 48 on a plane perpendicular to the Z direction.

Each of the semiconductor modules 11*a* includes control terminals 110 through which controlling current is to flow and power terminals 111 through which controlled current is to flow. The control terminals 110 protrude in the X direction toward the opening 450 of the case 4, whereas the power terminals 111 protrude in the X direction toward the capacitor 11*c*. The control terminals 110 are connected to the control circuit board 11*b* that is located closer to the opening 450 of the case 4 than the stacked body 119 is. The power terminals 111 include a positive terminal to be electrically connected to the cathode of a DC power source (not shown), a negative terminal to be electrically connected to the anode of the DC power source, and three AC terminals to be electrically connected to an AC load.

The positive terminal is connected to a positive bus bar 112*a*, while the negative terminal is connected to a negative bus bar 112*b*. The positive and negative bus bars 112*a* and 112*b* are respectively connected, along with a pair of electrodes of the capacitor 11*c*, to the two first bus bars 2. That is, the first bus bars 2 are employed to electrically connect the semiconductor modules 11*a* and the capacitor 11*c* to the DC power source.

The three AC terminals are respectively connected to the three second bus bars 8 that respectively correspond to the U, V, and W phases of three-phase AC power. That is, the three second bus bars 8 are employed to electrically connect the semiconductor modules 11*a* to the AC load which is implemented by, for example, a three-phase AC motor. Moreover, the second bus bars 8 are sealed with an insulative resin member 113 so as to be electrically insulated from each other. Further, the second bus bars 8 are fixed to the frame 114 via the resin member 113.

The control circuit board 11*b* has a control circuit (not shown) formed therein. The control circuit controls the on/off operations of the switching elements of the semiconductor modules 11*a*, thereby converting a DC voltage applied between the two first bus bars 2 to a three-phase AC voltage. The obtained three-phase AC voltage is then output via the three second bus bars 8, thereby driving the three-phase AC motor.

Referring to FIG. 5, the frame 114 has a boss portion 114*b* that protrudes in the X direction toward the front wall 44 of the case 4. The terminal block 60 is fixed, together with the drop prevention member 69, to the frame 114 by inserting the bolt 619 through the fixing through-hole 610 formed in the terminal block 60 and tightening the bolt 619 into a tapped hole (not shown) formed in the boss portion 114*b* of the frame 114.

After fixing the integral piece of the terminal block 60 and the drop prevention member 69 to the frame 114, the connection portions 21 of the first bus bars 2 are positioned closer to the capacitor 11*c* than the drop prevention wall 6 is, as shown in FIG. 6. Moreover, when viewed along the insertion direction of the bolts 5, the connection portions 21 of the first bus bars 2 are positioned inside the drop prevention wall 6, as shown in FIG. 5. In addition, the connection portions 80 of the second bus bars 8 are located on the mounting surface 66 of the terminal block 60.

The above-described assembly 10 according to the present embodiment is made in the following way.

First, the stacked body 119 is placed in the frame 114 and fixed therein by using the spring member 15. Further, the capacitor 11*c* is fixed to the frame 114. Then, the control circuit board 11*b* is connected to the control terminals 110 of the semiconductor modules 11*a*, and the first and second bus bars 2 and 8 are welded to the power terminals 111 of the semiconductor modules 11*a*. Thereafter, the integral piece of the terminal block 60 and the drop prevention member 69 is fixed to the frame 114 by using the bolt 619. Consequently, when viewed along the insertion direction of the terminals 30 of the first external connector 3, the distal ends 2*b* of the distal portions 24 of the first bus bars 2 are located behind a front portion 61 of the drop prevention wall 6, as shown in FIG. 6. In other words, the distal ends 2*b* overlap the drop prevention wall 6 in the insertion direction of the terminals 30 (i.e., in the X direction).

Next, the frame 114, which has the stacked body 119 and the integral piece of the terminal block 60 and the drop prevention member 69 fixed thereto, is placed in the case 4 and fixed therein by using bolts (not shown). Thereafter, the lid 400 is fixed to the case 4 to close the opening 450 of the case 4.

As a result, the assembly 10 according to the present embodiment is obtained.

The first external connector 3 is connected to the assembly 10 in the following way.

First, referring to FIGS. 6 and 7, the terminal seat portion 35 of the first external connector 3 is inserted into the case 4 through the opening 42 of the case 4, so as to be located within the open space formed between the capacitor 11*c* and the connection portions 21 of the first bus bars 2. As a result, the protruding portion 32 of the first external connector 3 is fitted in the opening 42 of the case 4; the body portion 31 of the first external connector 3 is brought into abutment with the front wall 44 of the case 4; each of the through-holes 310 of the terminals 30 of the first external connector 3 is brought into alignment with a corresponding one of the through-holes 20 of the connection portions 21 of the first bus bars 2. In addition, the confinement space S is formed by the drop prevention wall 6, the connection portions 21 of the first bus bars 2, and the terminal seat portion 35 of the first external connector 3.

Next, the first external connector 3 is fixed to the case 4 by using bolts (not shown). Then, a seal member (not shown) is interposed between the protruding portion 32 of the first external connector 3 and an inner surface of the case 4 which defines the opening 42, thereby water-tightly sealing the clearance therebetween.

Thereafter, each of the bolts 5 is placed inside the case 4 through the opening 40 of the case 4, inserted through a corresponding one of aligned pairs of the through-holes 20 of the connection portions 21 of the first bus bars 2 and the through-holes 310 of the terminals 30 of the first external connector 3, and tightened into a corresponding one of the nuts 34 embedded in the terminal seat portion 35 of the first external connector 3. Consequently, the connection portions 21 of the first bus bars 2 are respectively connected to the terminals 30 of the first external connector 3 by the engagement between the corresponding pairs of the bolts 5 and the nuts 34.

In addition, according to the present embodiment, if the bolts 5 are accidentally dropped during the connecting of the connection portions 21 to the corresponding terminals 30, they will be confined within the confinement space S and thus prevented from dropping outside the confinement space S, as shown in FIG. 8.

The second external connector 13 is connected to the assembly 10 in the following way.

Figure 12:
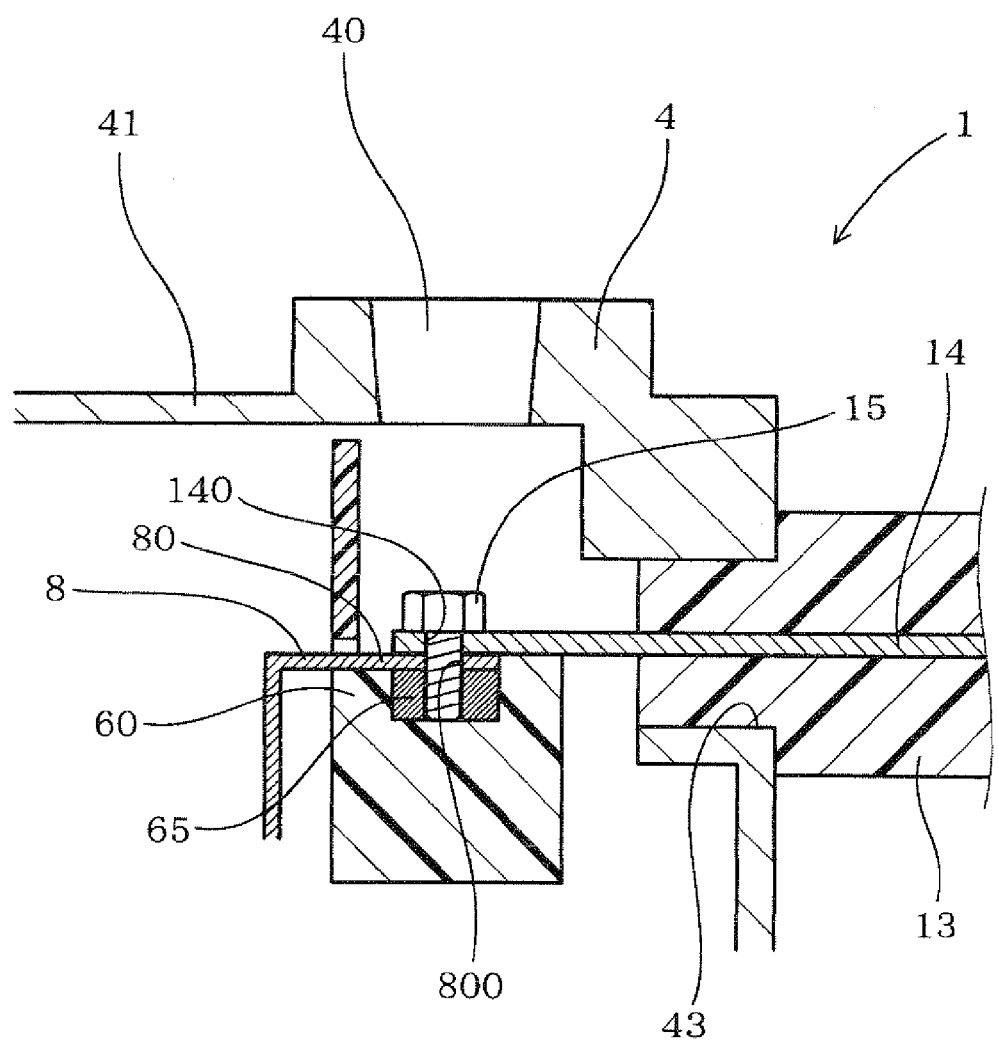
FIG. 12 is an enlarged partially cross-sectional view taken along the line B-B in FIG. 3, wherein terminals of the second external connector are inserted into the case of the assembly and connected with the second bus bars of the assembly.

First, referring to FIG. 12, the terminals 14 of the second external connector 13 are inserted into the case 4 through the opening 43 of the case 4, thereby bringing each of through-holes 140 formed in the terminals 14 of the second external connector 13 into alignment with a corresponding one of through-holes 800 formed in the connection portions 80 of the second bus bars 8. Then, the second external connector 13 is fixed to the case 4 by using bolts (not shown).

Next, each of the bolts 15 is placed inside the case 4 through the opening 40 of the case 4, inserted through a corresponding one of aligned pairs of the through-holes 140 of the terminals 14 of the second external connector 13 and the through-holes 800 of the connection portions 80 of the second bus bars 8, and tightened into a corresponding one of the nuts 65 embedded in the terminal block 60. Consequently, the connection portions 80 of the second bus bars 8 are respectively connected to the terminals 14 of the second external connector 13 by the engagement between the corresponding pairs of the bolts 15 and the nuts 65.

Thereafter, referring to FIGS. 1 and 7, by tightening each of bolts 475 into a corresponding one of the tapped holes 47 formed in the rim portion 480 of the case 4, the lid 49 is fixed to the case 4 to close the opening 40.

In addition, it should be noted that the connecting of the first external connector 3 to the assembly 10 may be performed either before or after the connecting of the second external connector 13 to the assembly 10.

According to the present embodiment, it is possible to achieve the following advantages.

In the assembly 10, as shown in FIGS. 6 and 7, there is interposed the drop prevention member 69 between the top wall 41 of the case 4 and the connection portions 21 of the first bus bars 2. Moreover, after inserting the terminals 30 of the first external connector 3 into the case 4 through the opening 42, there is defined the confinement space S by the drop prevention wall 6, the connection portions 21 of the first bus bars 2, and part of the first external connector 3.

Consequently, as shown in FIG. 8, even if the bolts 5 are accidentally dropped during the connecting of the connection portions 21 to the corresponding terminals 30 (i.e., during establishment of the engagement between the corresponding pairs of the bolts 5 and the nuts 34), the bolts 5 will be confined within the confinement space S and thus prevented from dropping outside the confinement space S into the interior of the case 4. As a result, the bolts 5 can be easily picked up, thereby making it possible to immediately resume the fixing process. In addition, it is also possible to prevent the electronic components 11 from being hit and thereby damaged by the bolts 5. As a result, high reliability of the electronic components 11 can be secured.

In the present embodiment, the connection portions 21 of the first bus bars 2 are configured to be mounted on the terminal seat portion 35 of the first external connector 3. That is, the assembly 10 itself has no terminal seat arranged in the case 4 for mounting the connection portions 21 of the first bus bars 2 thereon. Accordingly, it is impossible for the assembly 10 to have a drop prevention wall which is formed to protrude from a terminal seat arranged in the case 4 toward the opening 40 of the case 4.

In consideration of the above, in the present embodiment, the assembly 10 is configured to include the drop prevention member 69 as a component thereof. Consequently, it becomes possible to form the confinement space S in the assembly 10 without having a terminal seat arranged in the case 4.

Moreover, it may be possible to configure the case 4 to have a drop prevention wall which extends from the top wall 41 of the case 4 toward the connection portions 21 of the first bus bars 2. However, in this case, since the case 4 is made of a metal, electric leakage may occur upon contact between the drop prevention wall of the case 4 and the first bus bars 2.

In comparison, in the present embodiment, the drop prevention member 69 is made of a resin, and thus it is possible to prevent such electric leakage from occurring in the assembly 10.

Furthermore, it also may be possible to form a drop prevention wall in the first external connector 3 and enlarge the opening 42 of the case 4 accordingly so as to allow the drop prevention wall can be placed inside the case 4 through the opening 42. However, in this case, it is necessary to employ a considerably large seal member to seal the clearance between the first external connector 3 and the inner surface of the case 4 which defines the enlarged opening 42.

In comparison, in the present embodiment, the drop prevention wall 6 is not formed in the first external connector 3, and thus it is possible to minimize the opening 42 of the case 4.

Further, in present embodiment, the first external connector 3 includes the terminal seat portion 35 that has the terminals 30 arranged thereon. The terminal seat portion 35 also defines, together with the drop prevention wall 6 and the connection portions 21 of the first bus bars 2, the confinement space S for confining the bolts 5.

Consequently, by utilizing the terminal seat portion 35, it becomes possible to form the confinement space S without configuring the first external connector 3 to further include a dedicated portion for forming the confinement space S. As a result, the configuration of the first external connector 3 is simplified, thereby facilitating the insertion of the first external connector 3 into the case 4 through opening 42.

In the present embodiment, the assembly 10 includes the terminal block 60 that has the mounting surface 66 on which the connection portions 80 of the second bus bars 8 are connected with the corresponding terminals 14 of the second external terminal 13. The terminal block 60 is integrally formed with the drop prevention member 69 into one piece.

With the above integral formation, the parts count and thus the manufacturing cost of the assembly 10 can be reduced.

In the present embodiment, as shown in FIG. 7, both the clearance 16 between the drop prevention wall 6 and the first bus bars 2 and the clearance 161 between the drop prevention wall 6 and the first external connector 3 are set to be less than the length L of the head portions 50 of the bolts 5.

Setting the clearances 16 and 161 as above, it is possible to reliably prevent the bolts 5 from dropping outside the confinement space S through the clearances 16 and 161.

Further, in the present embodiment, the clearance 17 between the inner surface of the top wall 41 of the case 4 and the drop prevention wall 6 is also set to be less than the length L of the head portions 50 of the bolts 5.

Setting the clearance 17 as above, it is possible to reliably prevent the bolts 5 from dropping outside the confinement space S through the clearance 17.

In the present embodiment, as shown in FIG. 6, each of the first bus bars 2 is bent toward the top wall 41 of the case 4 to have the distal portion 24 that extends from the connection portion 21 of the first bus bar 2 obliquely with respect to the connection portion 21. Moreover, the distal portions 24 of the first bus bars 2 are located so that when viewed along the insertion direction of the terminals 30 of the first external connector 3, the distal ends 2b of the distal portions 24 are positioned behind the front portion 61 of the drop prevention wall 6 which faces the front wall 44 of the case 4.

Figure 11:
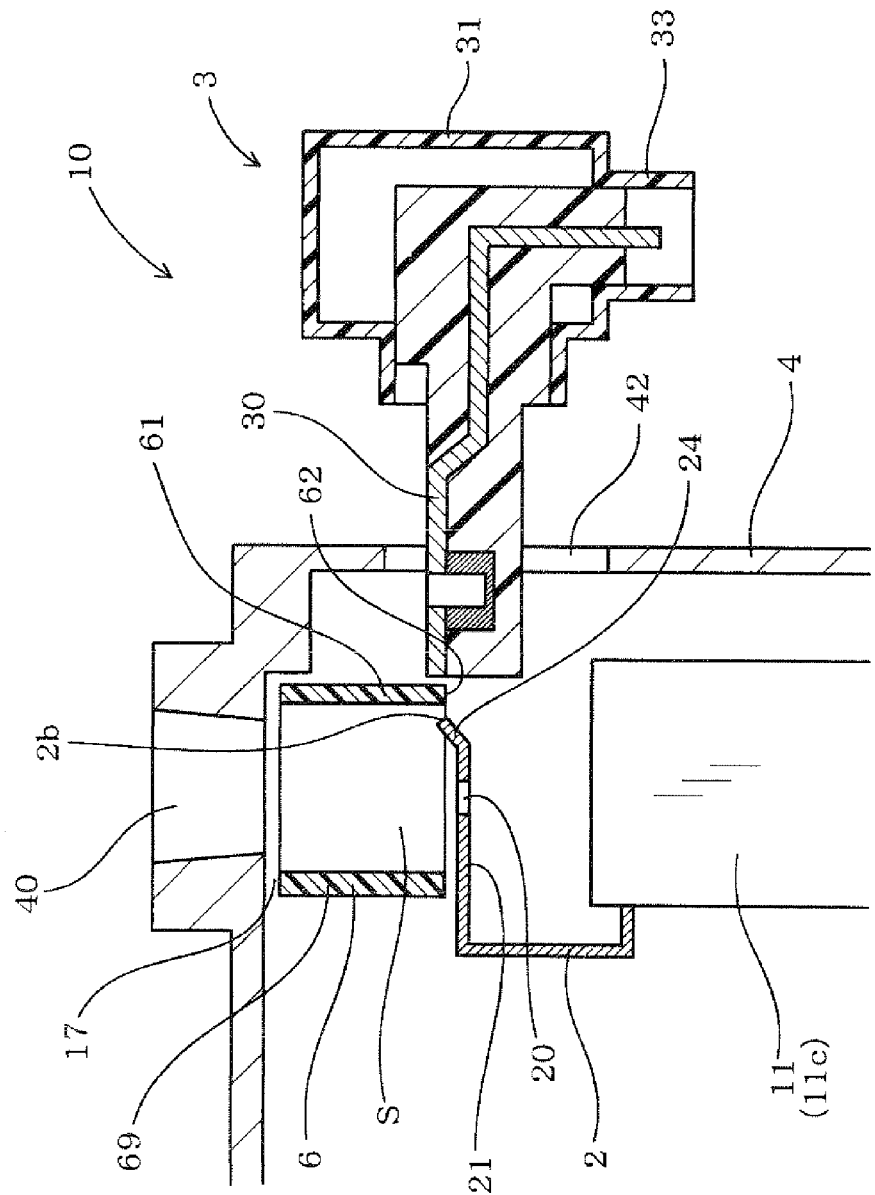
FIG. 11 is a partially cross-sectional view illustrating the positional relationship between the distal ends of the first bus bars and a drop prevention wall of the drop prevention member.

With the above location of the distal portions 24 of the first bus bars 2, even if the terminals 30 of the first external connector 3 are incorrectly positioned to collide with the front portion 61 of the drop prevention wall 6, as shown in FIG. 11, it is still possible to reliably prevent the distal ends 2b of the distal portions 24 from being hit by the terminals 30 and thereby being undesirably deformed.

Second Embodiment

Figure 18:
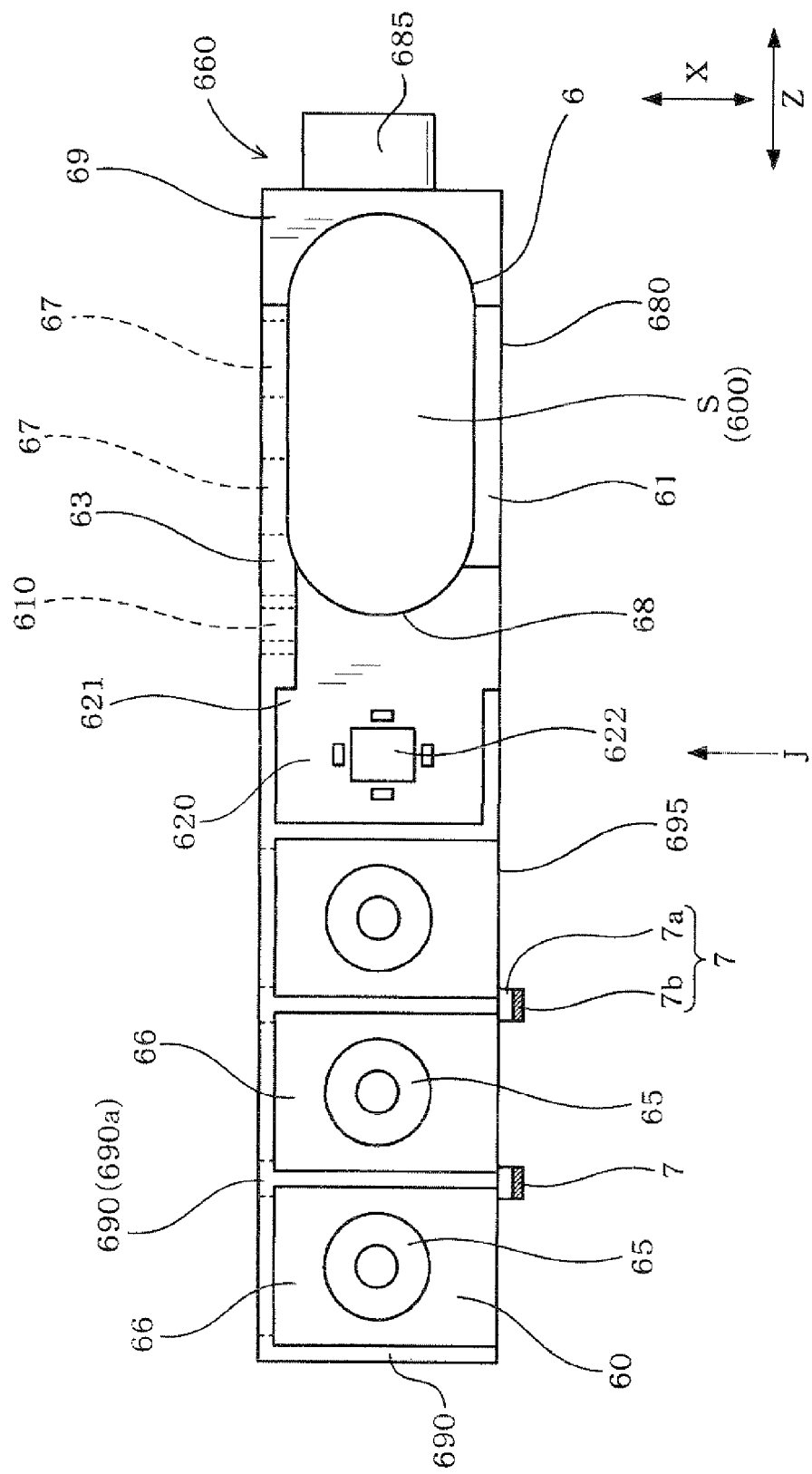
FIG. 18 is a top view of a drop prevention member of the assembly according to the second embodiment.
Figure 19:
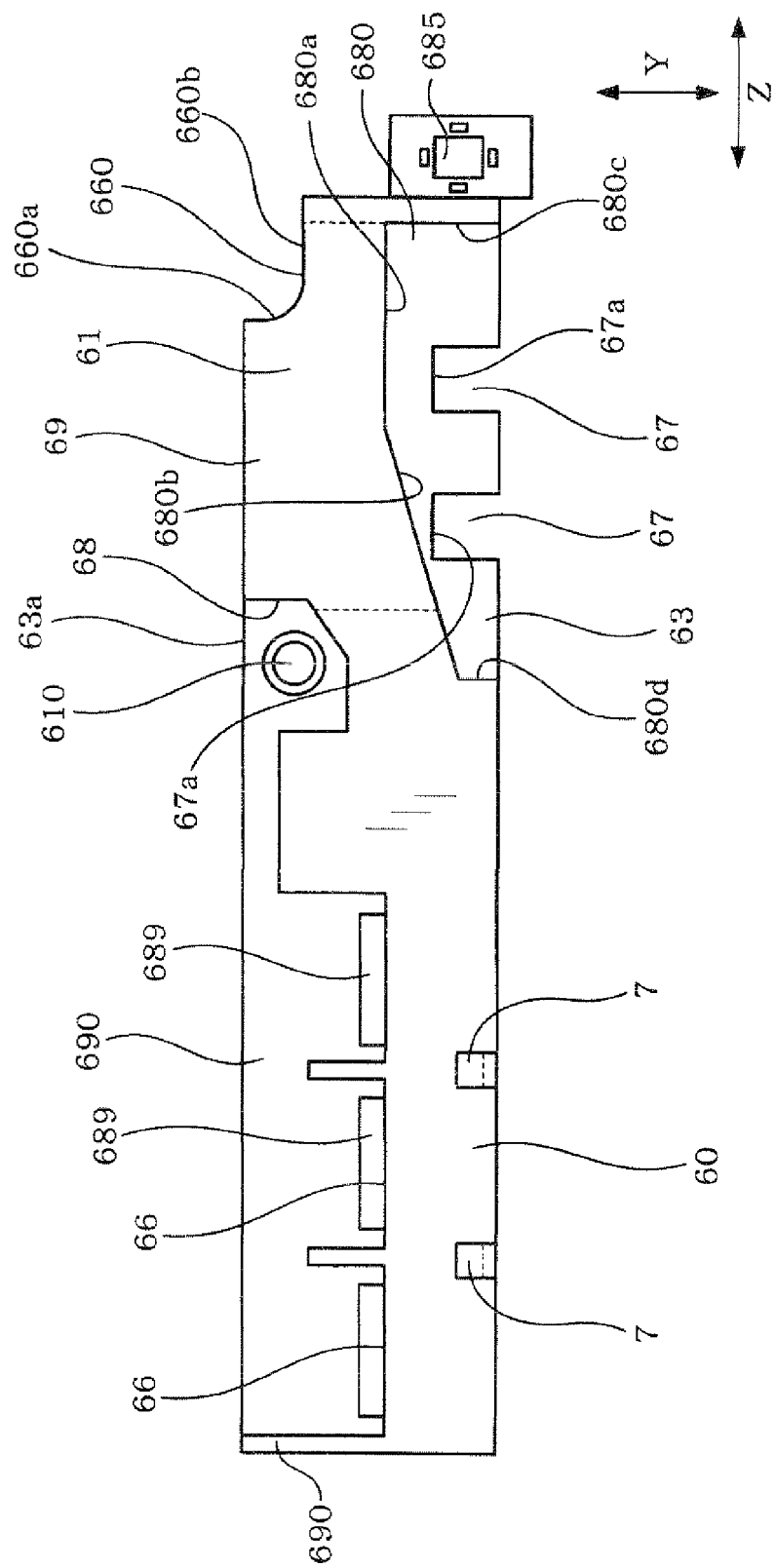
FIG. 19 is a side view of the drop prevention member along the direction J in FIG. 18.
Figure 20:
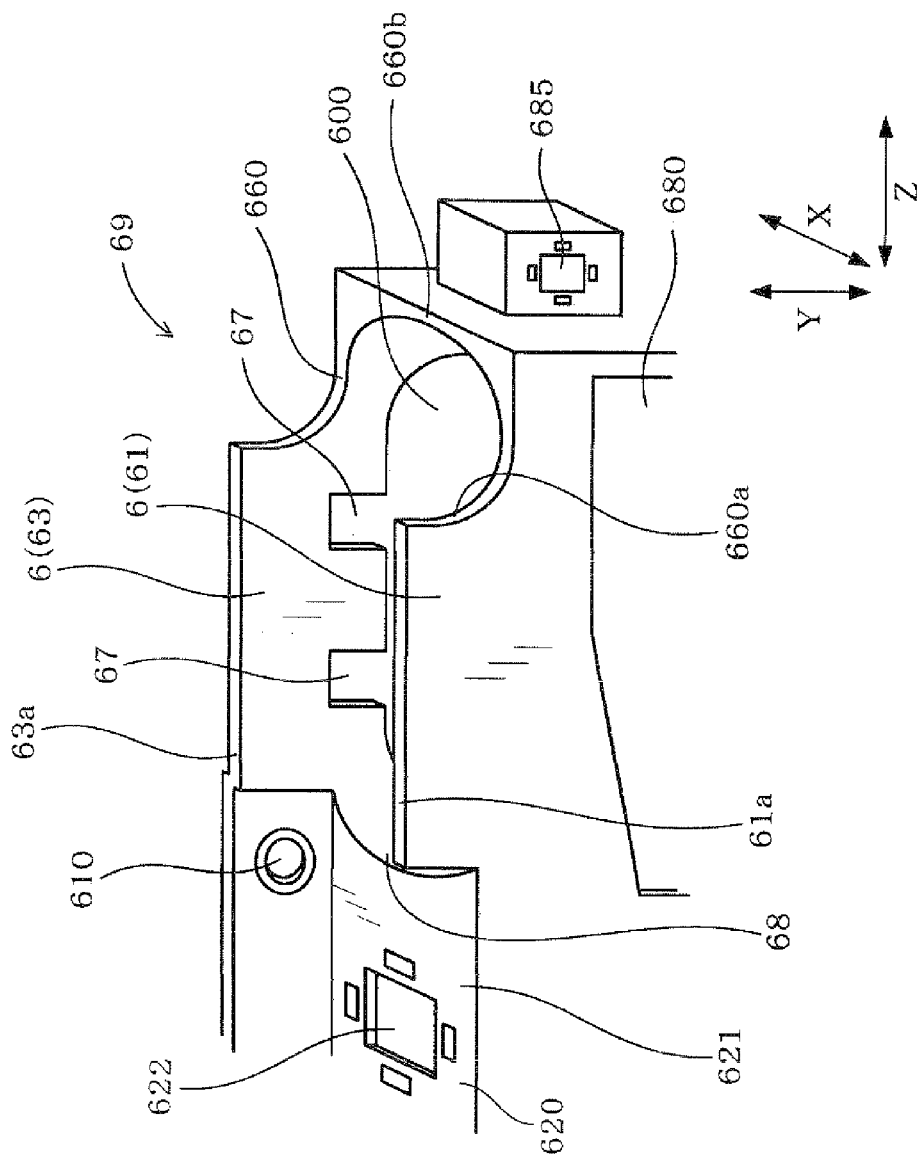
FIG. 20 is an enlarged perspective view showing part of the drop prevention member of FIG. 18.

In this embodiment, as shown in FIGS. 18-20, the drop prevention member 69, the terminal block 60, and a mount 620 for mounting a body-side portion 74 of a later-described first power supply stop mechanism are integrally formed into one piece.

More specifically, the drop prevention member 69, the terminal block 60, and the mount 620 are one-piece molded using an insulative resin. The integral piece has, when viewed along the Y direction (i.e., the direction perpendicular to the paper surface of FIG. 18), a substantially rectangular shape with the mount 620 positioned between the drop prevention member 69 and the terminal block 60 in the Z direction.

Figure 25:
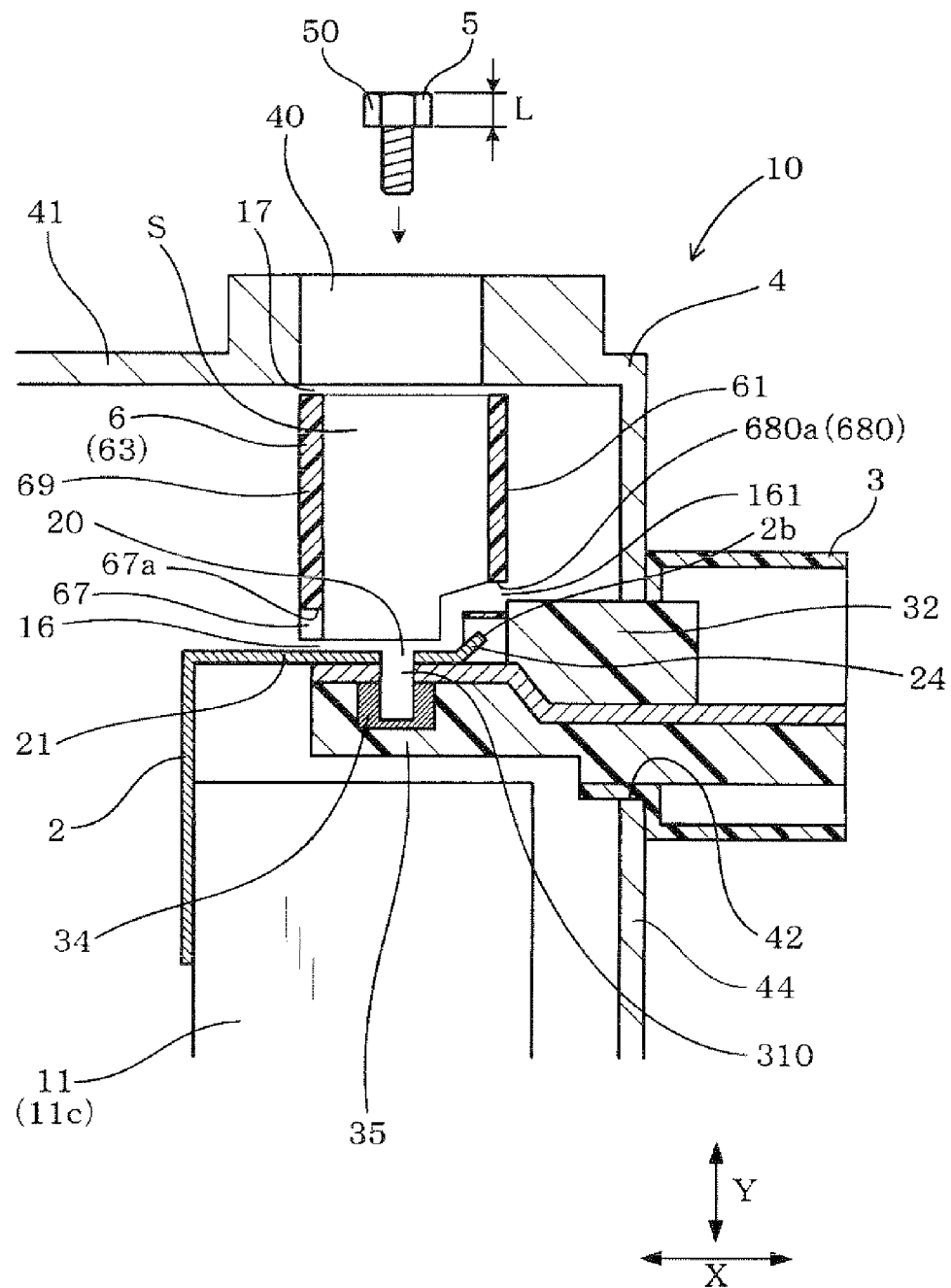
FIGS. 25 and 26 are schematic views illustrating a process of connecting the first external connector to the assembly according to the second embodiment.

The drop prevention wall 6 of the drop prevention member 69 has the front portion 61 that faces the front wall 44 of the case 4 as shown in FIG. 25. The drop prevention wall 6 also has a rear portion 63 that is opposed to the first portion 61 in the insertion direction of the terminals 30 of the first external connector 3 (i.e., in the X direction) with the through-hole 600 (or the confinement space S) formed therebetween.

The rear portion 63 of the drop prevention wall 6 has two substantially rectangular notches 67 formed therein for preventing interference with the first bus bars 2. More specifically, the notches 67 are formed by cutting the first bus bars 3-side end of the rear portion 63 in the Y direction at predetermined positions in the Z direction so as to respectively align with the first bus bars 2 as shown in FIG. 25. The width of the notches 67 in the Z direction is set to be less than the inscribed circle diameter of the head portions 50 of the bolts 5. Moreover, the length of the notches 67 in the Y direction is also set to be less than the inscribed circle diameter of the head portions 50 of the bolts 5. Furthermore, as shown in FIG. 25, the bottoms 67a of the notches 67 are positioned in the Y direction closer to the top wall 41 of the case 4 than the distal ends 2b of the first bus bars 2 are.

On the other hand, the front portion 61 of the drop prevention wall 6 has a cut portion 680 that is formed by cutting the capacitor 11c-side end of the front portion 61 in the Y direction at a predetermined position in the Z direction so as to allow the terminals 30 of the first external connector 3 to be placed inside the drop prevention wall 69 through the cut portion 680. The width of the cut portion 680 in the Z direction is greater than the width of the notches 67 in the Z direction. Moreover, as shown in FIG. 19, both the notches 67 are viewable from the front side through the cut portion 680. The cut portion 680 has a pair of side surfaces 680c and 680d that are both parallel to the Y direction and face each other in the Z direction, a bottom surface 680a that adjoins the side surface 680c and extends parallel to the Z direction, and an oblique surface 680b that extends obliquely between the bottom surface 680a and the side surface 680d. Referring to FIG. 25, after placing the terminals 30 of the first external connector 3 inside the drop prevention wall 6 through the cut portion 680, all of the clearances between the surfaces 680a-680d of the cut portion 680 and the protruding portion 32 of the first external connector 3 are less than the length L of the head portions 50 of the bolts 5.

The integral piece of the drop prevention member 69, the terminal block 60, and the mount 620 has a fixing through-hole 610 which is formed close to the rear portion 63 of the drop prevention wall 6 and through which a bolt 619 (shown in FIG. 23) is to be inserted for fixing the integral piece to the frame 114. More specifically, the fixing through-hole 610 is formed to penetrate through a mounting wall 690 of the integral piece in the X direction. In addition, the integral piece has no wall formed in front of the fixing through-hole 610 so that the fixing through-hole 610 is viewable from the front side of the integral piece.

The drop prevention wall 6 has a cut portion 68 formed therein for preventing interference with a tool 110 (shown in FIG. 23) for inserting the bolt 619 through the fixing through-hole 610. More specifically, as shown in FIG. 20, the cut portion 68 is formed by cutting away that portion of the drop prevention wall 6 which extends between the front and rear portions 61 and 63 at the mount 20-side end in the Z direction from the top surfaces 61a and 63a of the front and rear portions 61 and 63 to a mounting wall 621 of the mount 620.

The drop prevention wall 6 also has a recessed portion 660 formed therein for preventing interference with later-described lid fixing parts 46 (shown in FIG. 21) of the rim portion 480 of the case 4. More specifically, as shown in FIG. 20, the recessed portion 660 is formed by cutting away an end portion of the drop prevention wall 6 on the opposite side to the mount 20 from the top surfaces 61a and 63a of the front and rear portions 61 and 63 by a predetermined length in the Y direction. The recessed portion 660 has a pair of concave arc-shaped surfaces 660a that respectively adjoin the top surfaces 61a and 63a of the front and rear portions 61 and 63 and a flat surface 660b that extends in the X direction between the arc-shaped surfaces 660a.

The mount 620 is formed between the drop prevention member 69 and the terminal block 60 in the Z direction for mounting the body-side portion 74 (shown in FIG. 14) of the first power supply stop mechanism.

Figure 16:
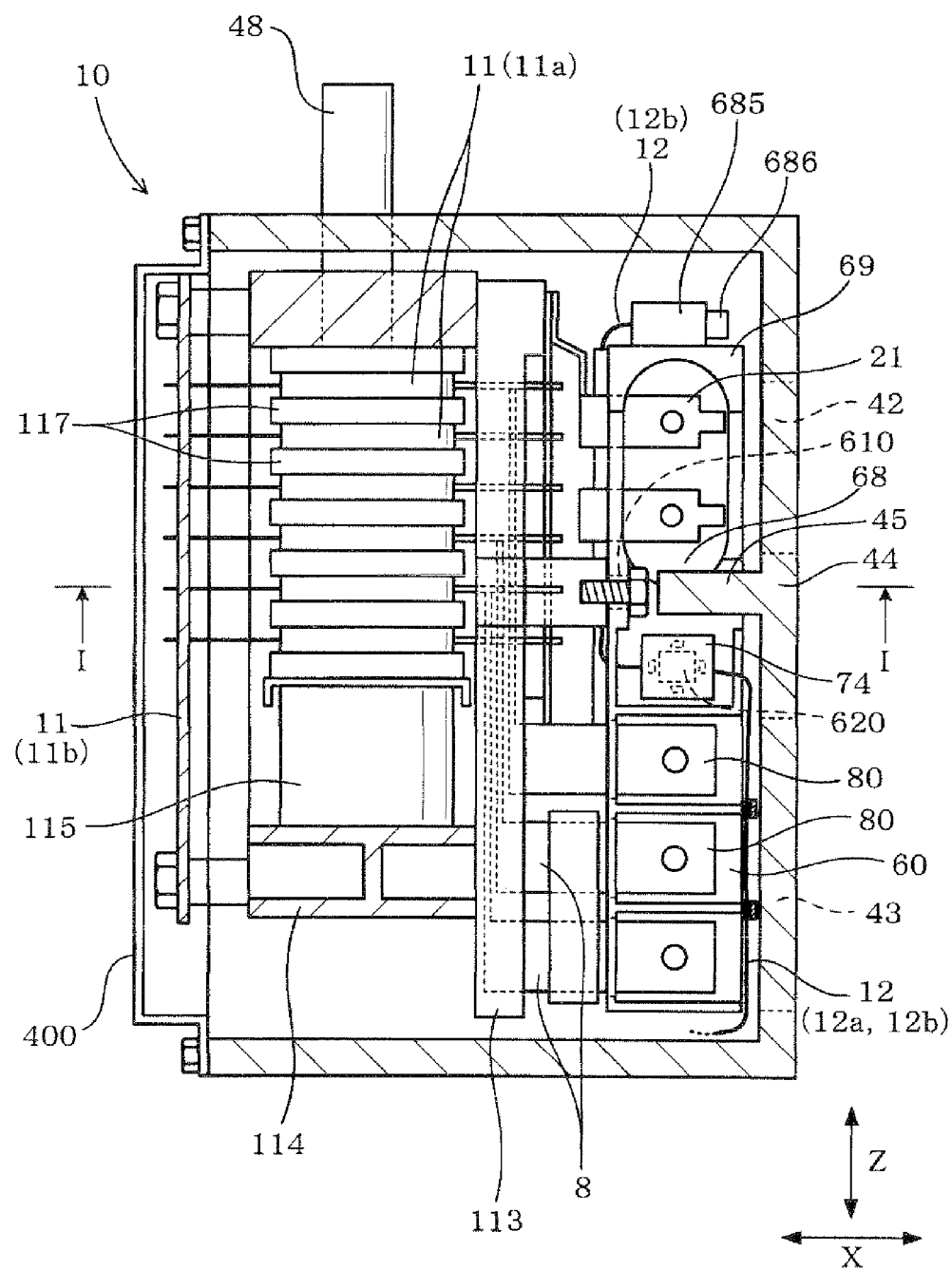
FIG. 16 is a partially cross-sectional view taken along the line H-H in FIG. 15.

The first power supply stop mechanism is configured to stop power supply to the electronic components 11 when the lid 49 (shown in FIG. 26) is detached from the case 4. More specifically, the first power supply stop mechanism is configured with the control circuit board 11b, the body-side portion 74, and a lid-side portion (not shown) that is attached to or detached from the body-side portion 74 depending on whether the lid 49 is attached to or detached from the case 4. As shown in FIG. 16, the body-side portion 74 is electrically connected to the control circuit board 11b via an electric wire 12a. Further, in the body-side portion 74 and the lid-side portion, there is provided, for example, a magnetic sensor (not shown). With the magnetic sensor, when the lid 49 is detached from the case 4 and thereby the lid-side portion of the first power supply stop mechanism is also detached from the body-side portion 74, the control circuit board 11b can sense the detachment of the lid 49 from the case 4. Upon sensing the detachment, the control circuit board 11 stops power supply to the electronic components 11, thereby preventing electric shock.

Referring to FIGS. 18 and 20, the mount 620 has a substantially rectangular mounting hole 622 that is formed to penetrate through the mounting wall 621 in the Y direction. The body-side portion 74 of the first power supply stop mechanism is mounted to the mount 620 by inserting engaging claws (not shown) of the body-side portion 74 into the mounting hole 622 and thereby making the engaging claws engage with the mounting wall 621.

The terminal block 60 has an outer side surface 695 that faces the front wall 44 of the case 4 and a pair of locking claws 7 formed on the outer side surface 695 for locking electric wires 12 (shown in FIG. 16). The electric wires 12 include the electric wire 12a for electrically connecting the body-side portion 74 of the first power supply stop mechanism to the control circuit board 11b and an electric wire 12b to be described later. Each of the locking claws 7 has a first portion 7a that protrudes from the outer side surface 695 of the mount 620 in the X direction and a second portion 7b that protrudes from the distal end of the first portion 7a in the Y direction. The electric wires 12 are disposed on the first portions 7a of the locking claws 7 and locked between the outer side surface 695 of the mount 620 and the second portions 7b of the locking claws 7.

The drop prevention member 69 also includes, as shown in FIGS. 18-19, a mount 685 for mounting a body-side portion 686 (shown in FIG. 15) of a second power supply stop mechanism.

The second power supply stop mechanism is configured to stop power supply to the electronic components 11 when the first external connector 3 is detached from the case 4. More specifically, the second power supply stop mechanism is configured with the control circuit board 11b, the body-side portion 686, and a connector-side portion (not shown) that is attached to or detached from the body-side portion 686 depending on whether the first external connector 3 is attached to or detached from the case 4. As shown in FIG. 16, the body-side portion 686 is electrically connected to the control circuit board 11b via the electric wire 12b. Further, in the body-side portion 686 and the connector-side portion, there is provided, for example, a magnetic sensor (not shown). With the magnetic sensor, when the first external connector 3 is detached from the case 4 and thereby the connector-side portion of the second power supply stop mechanism is also detached from the body-side portion 686, the control circuit board 11b can sense the detachment of the first external connector 3 from the case 4. Upon sensing the detachment, the control circuit board 11 stops power supply to the electronic components 11, thereby preventing electric shock.

The above-described assembly 10 according to the present embodiment is made in the following way.

Figure 22:
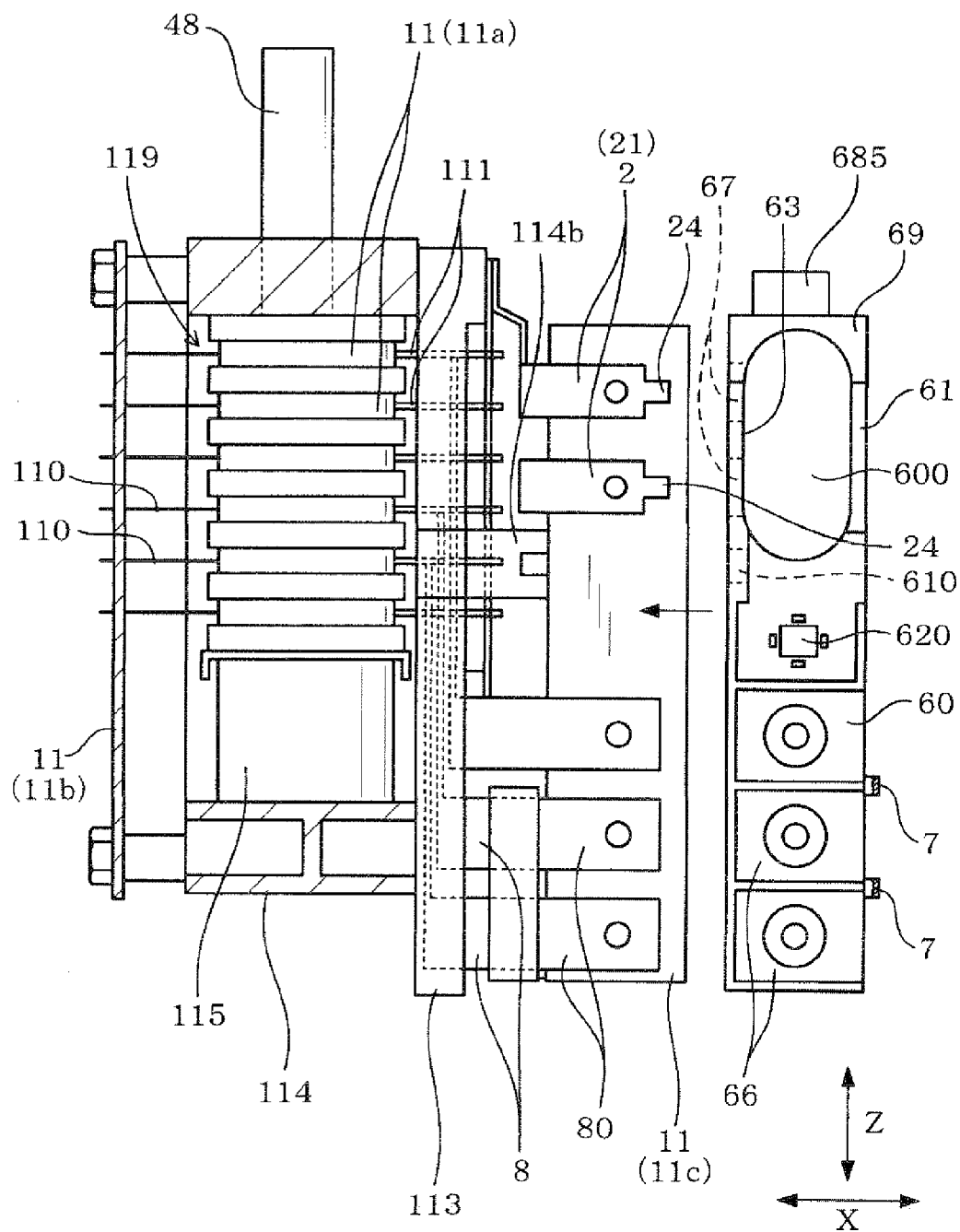
FIGS. 22 and 23 are schematic views illustrating a process of making the assembly according to the second embodiment.

First, referring to FIG. 22, the stacked body 119 is placed in the frame 114 and fixed therein by using the spring member 115. Further, the capacitor 11c is fixed to the frame 114. Then, the control circuit board 11b is connected to the control terminals 110 of the semiconductor modules 11a, and the first and second bus bars 2 and 8 are welded to the power terminals 111 of the semiconductor modules 11a.

Thereafter, the integral piece of the drop prevention member 69, the terminal block 60, and the mount 620 is moved toward the frame 114 for being fixed thereto.

In the present embodiment, it is impossible to move the integral piece toward the frame 114 in the Y direction. More specifically, the connection portions 80 of the second bus bars 8 are configured to be mounted on the mounting surface 66 (i.e., the top surface) of the terminal block 60. Therefore, if the integral piece is moved toward the frame 114 in the Y direction from the upper side, the terminal block 60 will interfere with the connection portions 80 of the second bus bars 8. On the other hand, the connection portions 21 of the first bus bars 2 are configured to be located under the drop prevention wall 6. Therefore, if the integral piece is moved toward the frame 114 in the Y direction from the lower side, the drop prevention wall 6 will interfere with the connection portions 21 of the first bus bars 2.

Moreover, it is also impossible to move the integral piece toward the frame 114 in the Z direction. This is because, if the integral piece is moved toward the frame 114 in the Z direction, the mount 685 of the drop prevention member 69 will interfere with the connection portions 21 of the first bus bars 2.

Accordingly, in the present embodiment, the integral piece is moved to toward the frame 114 in the X direction from the front side (i.e., the right side in FIG. 22).

In addition, referring to FIG. 25, the first bus bars 2 are bent upward to have the respective distal portions 24 extending obliquely with respect to the X direction. However, in the present embodiment, the rear portion 63 of the drop prevention wall 6 has formed therein the notches 67 which the distal portions 24 of the first bus bars 2 can respectively pass through. Consequently, it is possible to move the integral piece toward the frame 114 in the X from the front side without causing interference between the distal portions 24 of the first bus bars 2 and the rear portion 63 of the drop prevention wall 6.

After being moved to the frame 114, the integral piece is fixed to the frame 114 by inserting the bolt 619 through the fixing through-hole 610 formed in the integral piece and tightening the bolt 619 into the tapped hole (not shown) formed in the boss portion 114*b* of the frame 114.

Figure 23:
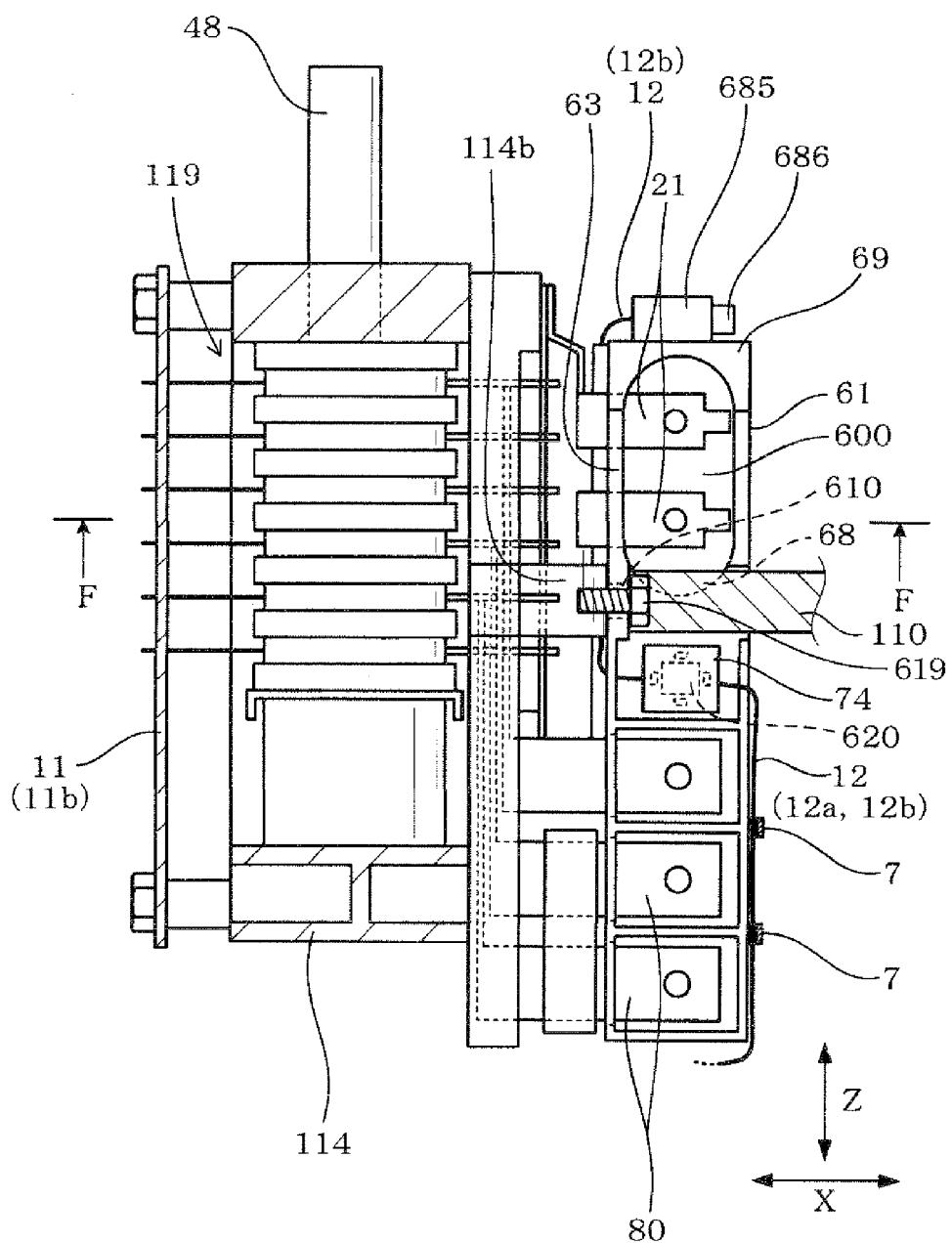

In addition, referring to FIG. 23, in fixing the integral piece to the frame 114, the tool 110 is moved toward the fixing through-hole 610 in the X direction from the front side (i.e., the right side in FIG. 23) to push and thereby insert the bolt 619 through the fixing through-hole 610. Then, the tool 110 is rotated about the axis of the bolt 619 to tighten the bolt 619 into the tapped hole formed in the boss portion 114*b* of the frame 114. During the manipulation (i.e., moving and rotating) of the tool 110, the manipulation area, within which the tool 110 is manipulated, partially overlaps the through-hole 600 of the drop prevention member 69. In consideration of the above, in the present embodiment, the drop prevention wall 6 is configured to have the cut portion 68 for preventing interference with the tool 110.

Further, the body-side portion 74 of the first power supply stop mechanism is mounted to the mount 620 of the integral piece, and the body-side portion 686 of the second power supply stop mechanism is mounted to the mount 685. Then, the body-side portions 74 and 686 of the first and second power supply stop mechanisms are connected to the control circuit board 11*b* via the electric wires 12*a* and 12*b*, respectively. Thereafter, the electric wires 12*a* and 12*b* are locked by the locking claws 7.

Next, the frame 114, which has the stacked body 119 and the integral piece of the drop prevention member 69, the terminal block 60, and the mount 620 fixed thereto, is placed in the case 4 and fixed therein by using bolts (not shown). Thereafter, the lid 400 is fixed to the case 4 to close the opening 450 of the case 4.

As a result, the assembly 10 according to the present embodiment is obtained.

Figure 14:
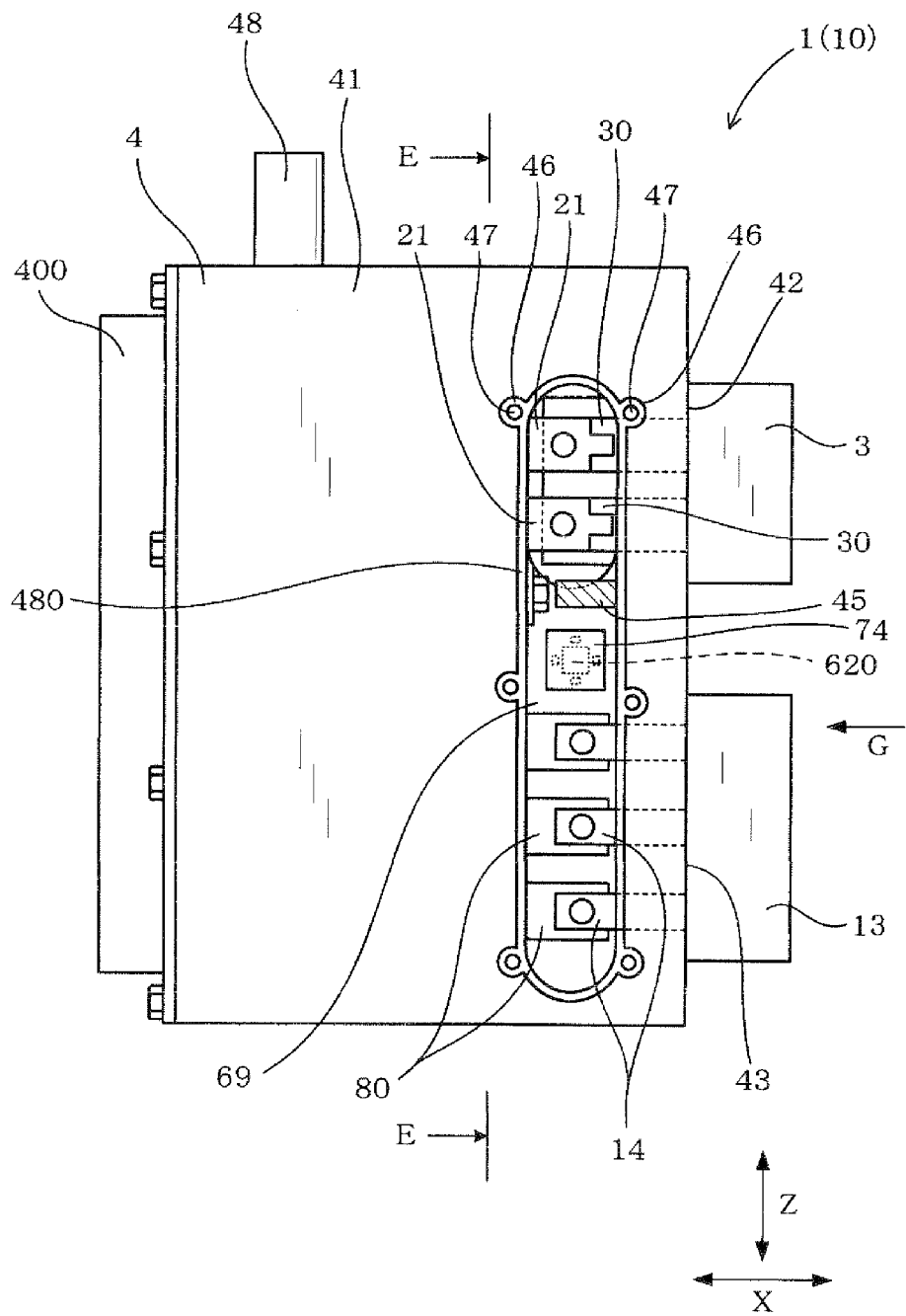
FIG. 14 is a top view of an assembly according to the second embodiment of the invention, wherein the terminals of the first and second external connectors are inserted in the case of the assembly but not connected with the first and second bus bars of the assembly.
Figure 15:
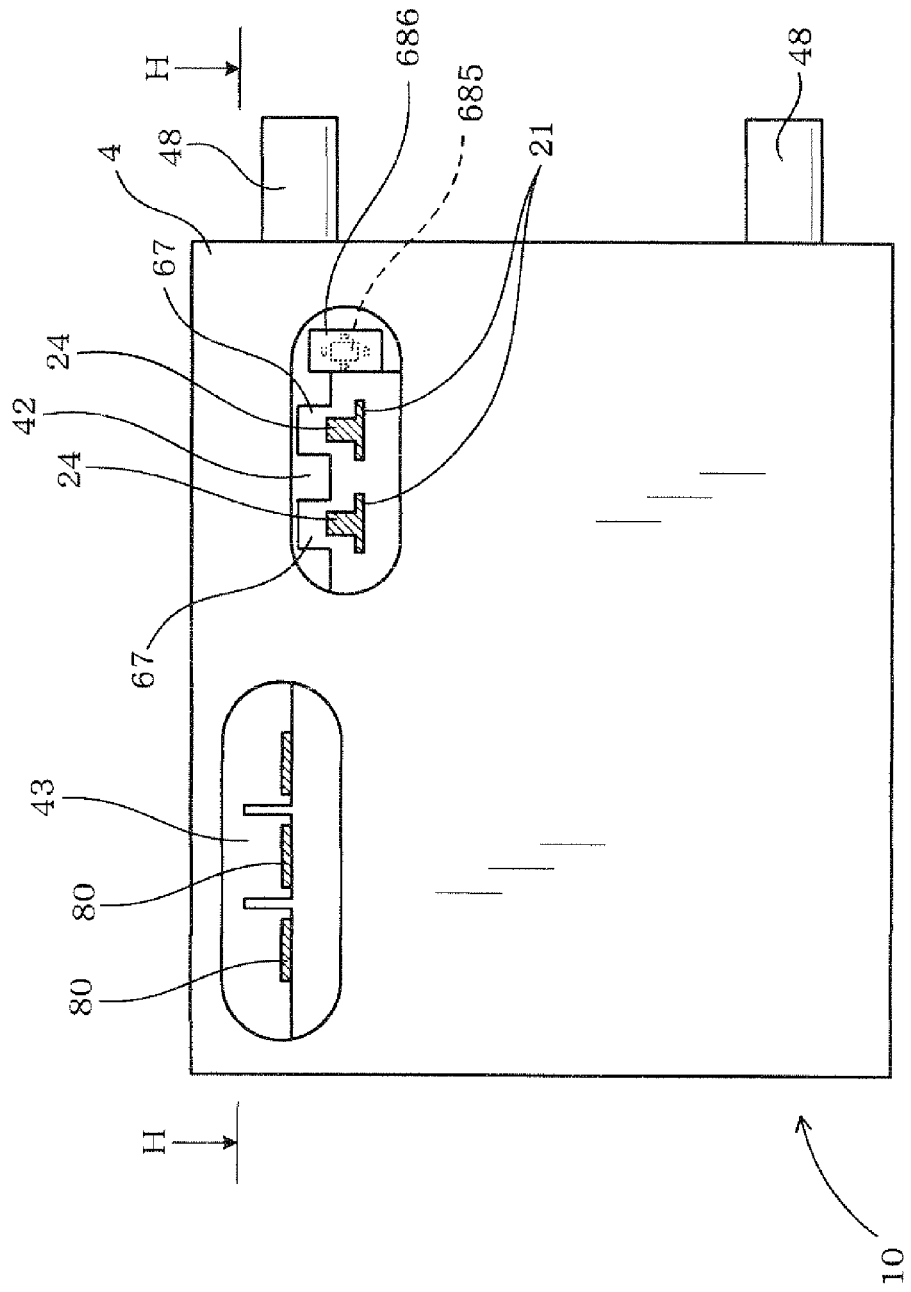
FIG. 15 is a side view of the assembly along the G direction in FIG. 14, wherein the first and second external connectors are removed from the assembly.
Figure 21:
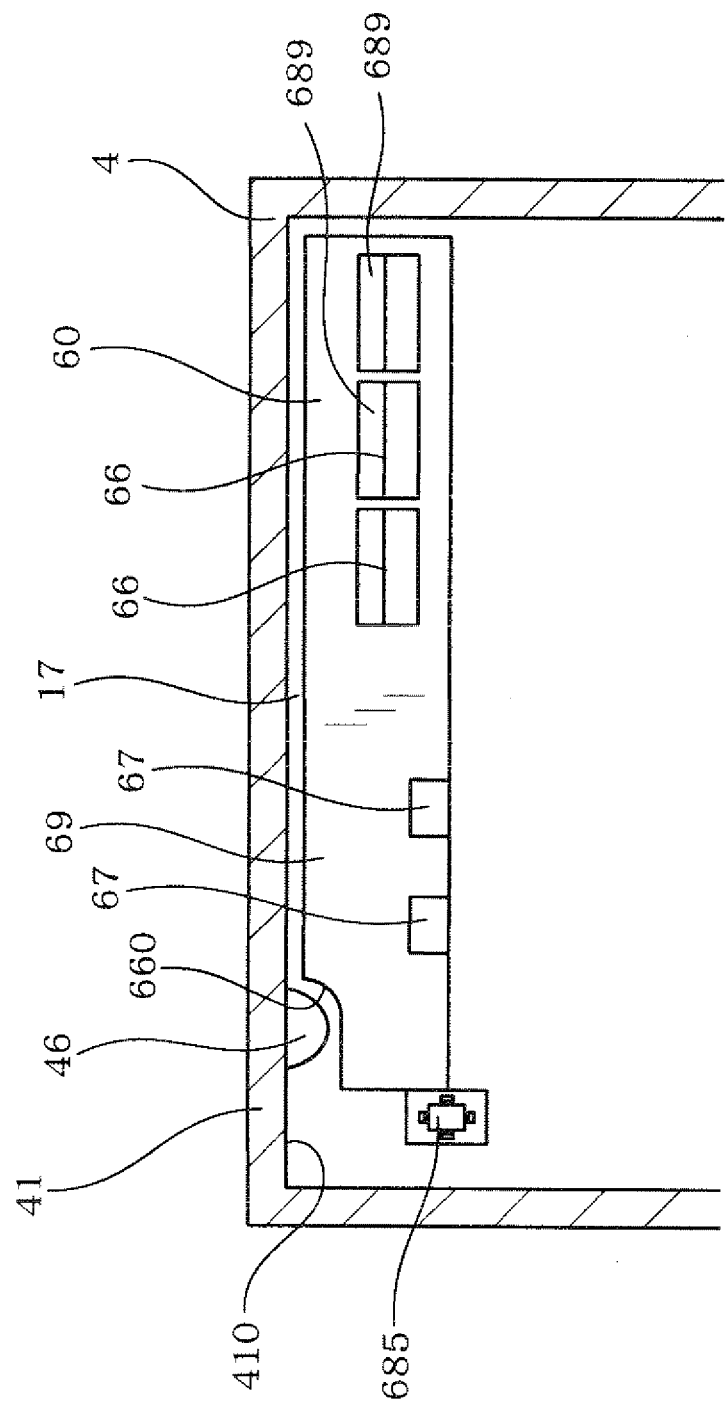
FIG. 21 is a partially cross-sectional view taken along the line E-E in FIG. 14.

Referring now to FIG. 14, in the present embodiment, the rim portion 480 of the case 4 includes the lid-fixing parts 46 each of which has one tapped hole 47 formed therein for fixing the lid 49 to the case 4. Referring further to FIG. 21, each of the lid-fixing parts 46 of the rim portion 480 is formed to protrude inward from the inner surface 410 of the top wall 41 of the case 4. However, since the drop prevention wall 6 has the recessed portion 660 formed therein, it is possible to prevent interference between the drop prevention wall 6 and the lid-fixing parts 46 of the rim portion 480 when the drop prevention member 69 is placed into the case 4 along with the frame 114.

Figure 17:
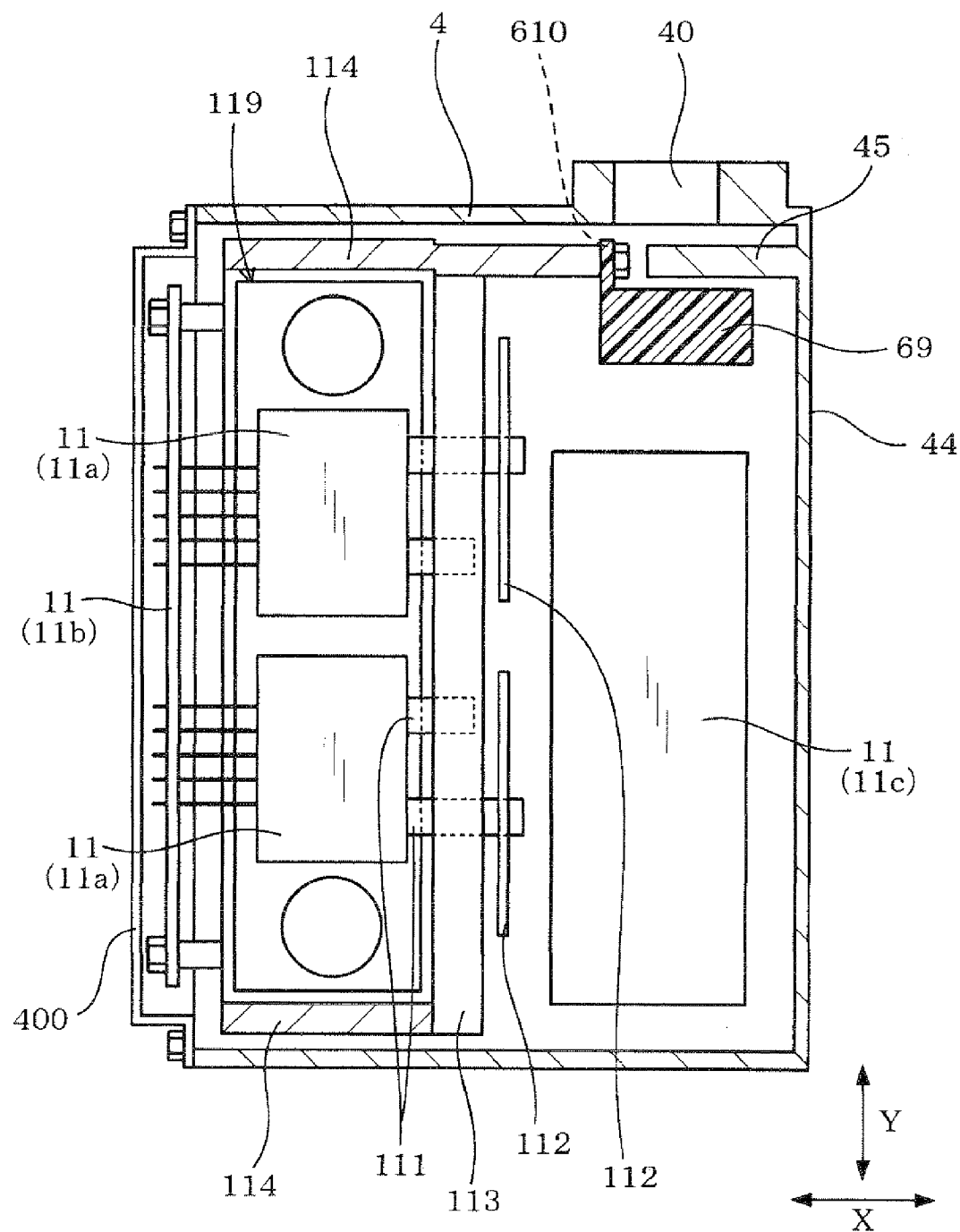
FIG. 17 is a partially cross-sectional view taken along the line I-I in FIG. 16.

Moreover, referring to FIGS. 16-17, in the present embodiment, the case 4 is configured to further include a protrusion 45 that protrudes inward in the X direction from the inner surface of the front wall 44 of the case 4. After the integral piece of the drop prevention member 69, the terminal block 60, and the mount 620 is placed in the case 4, the protrusion 45 is positioned to fill the cut portion 68 of the drop prevention wall 6.

The first external connector 3 is connected to the above-described assembly 10 in the following way.

Figure 24:
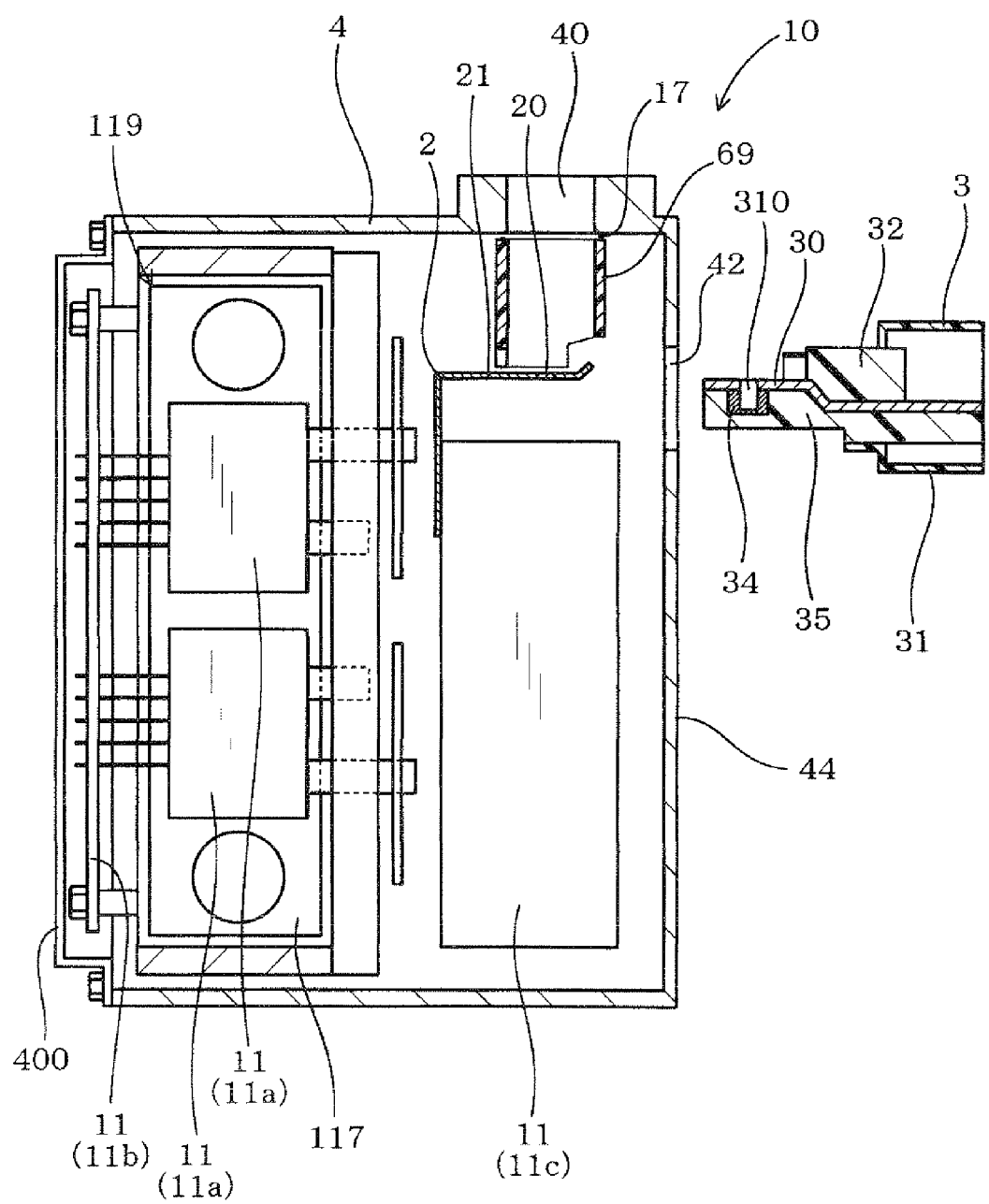
FIG. 24 is a partially cross-sectional view taken along the line F-F in FIG. 23, wherein the first external connector, which is not shown in FIG. 23, is added.

First, referring to FIG. 24, the terminal seat portion 35 of the first external connector 3 is inserted into the case 4 through the opening 42 of the case 4, so as to be located within the open space formed between the capacitor 11*c* and the connection portions 21 of the first bus bars 2.

Consequently, as shown in FIG. 25, the protruding portion 32 of the first external connector 3 is fitted in the opening 42 of the case 4. The body portion 31 of the first external connector 3 is brought into abutment with the front wall 44 of the case 4. Each of the through-holes 310 of the terminals 30 of the first external connector 3 is brought into alignment with a corresponding one of the through-holes 20 of the connection portions 21 of the first bus bars 2. The confinement space S is formed by the drop prevention wall 6, the connection portions 21 of the first bus bars 2, and the terminal seat portion 35 of the first external connector 3. Moreover, the clearance 161 between the front portion 61 of the drop prevention wall 6 and the first external connector 3 is greater than the clearance 16 between the connection portions 21 of the first bus bars 2 and those parts of the rear portion 63 of the drop prevention wall 6 where no notches 67 are formed.

Next, each of the bolts 5 is placed inside the case 4 through the opening 40 of the case 4, inserted through a corresponding one of aligned pairs of the through-holes 20 of the connection portions 21 of the first bus bars 2 and the through-holes 310 of the terminals 30 of the first external connector 3, and tightened into a corresponding one of the nuts 34 embedded in the terminal seat portion 35 of the first external connector 3. Consequently, the connection portions 21 of the first bus bars 2 are respectively connected to the terminals 30 of the first external connector 3 by the engagement between the corresponding pairs of the bolts 5 and the nuts 34.

Furthermore, the second external connector 13 is connected to the assembly 10 in the same manner as described in the previous embodiment.

Figure 26:
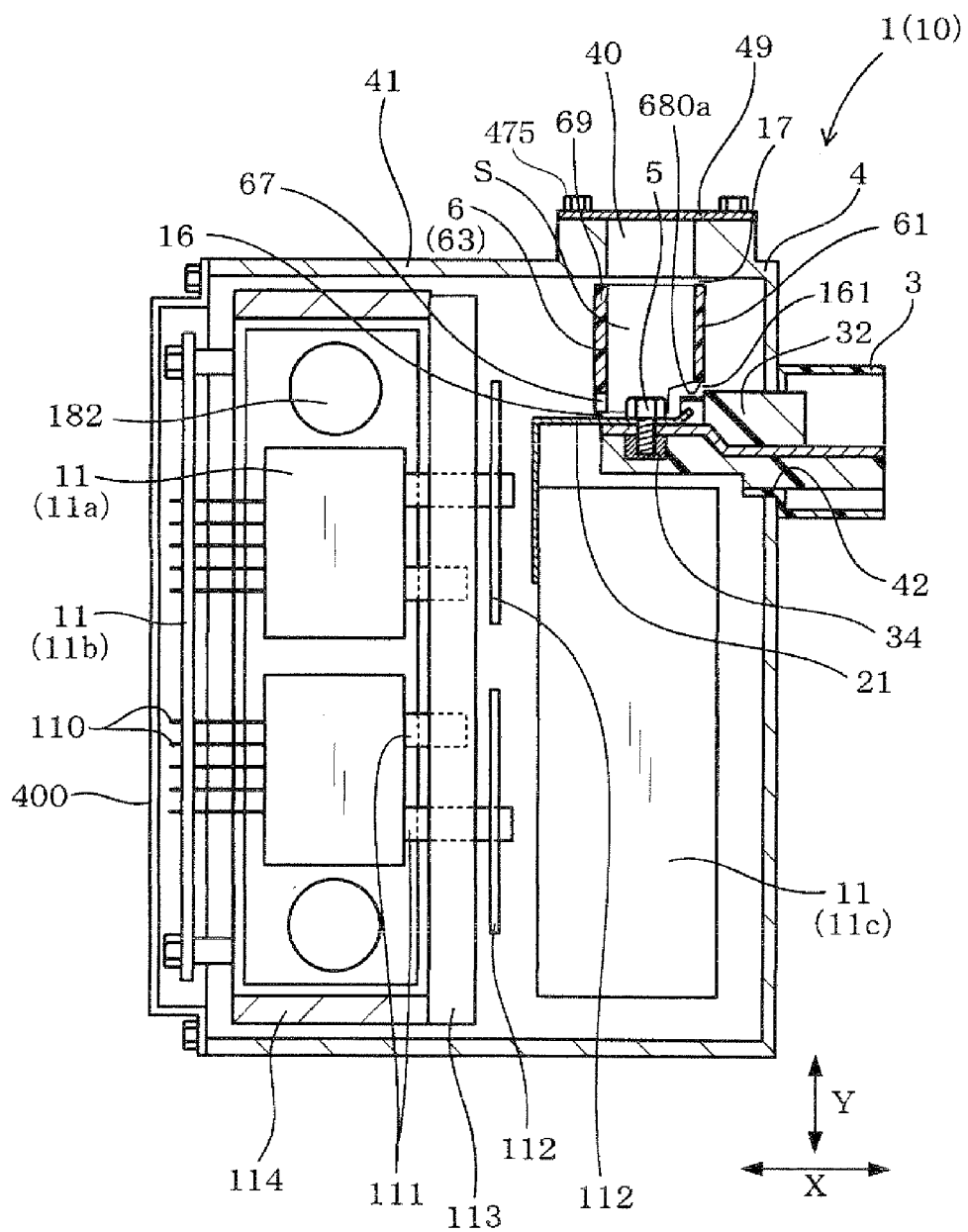

Thereafter, referring to FIG. 26, each of the bolts 475 is tightened into a corresponding one of the tapped holes 47 formed in the lid-fixing parts 46 of the rim portion 480 of the case 4, thereby fixing the lid 49 to the case 4 to close the opening 40; the lid 49 has the lid-side portion of the first power supply stop mechanism mounted thereto.

The assembly 10 according to the present embodiment has the same advantages as that according to the previous embodiment. In addition, the assembly 10 according to the present embodiment also has the following advantages.

In the present embodiment, as shown in FIG. 18, the mount 620 for mounting the body-side portion 74 of the first power supply stop mechanism is integrally formed with both the drop prevention member 69 and the terminal block 60 so as to be interposed therebetween.

Consequently, with the above integral formation, the parts count and thus the manufacturing cost of the assembly 10 can be reduced.

In the present embodiment, the body-side portions 74 and 686 of the first and second power supply stop mechanisms are electrically connected to the control circuit board 11*b* via the electric wires 12*a* and 12*b*, respectively. The electric wires 12*a* and 12*b* are locked by the locking claws 7 that are formed on the outer side surface 695 of the terminal block 60 which faces the front wall 44 of the case 4.

Consequently, with the locking claws 12a and 12b, it is possible to securely retain the electric wires 12a and 12b, thereby preventing them from interfering with other components of the assembly 10.

In the present embodiment, as shown in FIG. 25, after insertion of the first external connector 3 into the case 4 through the opening 42 of the case 4, the clearance 161 between the front portion 61 of the drop prevention wall 6 and the terminals 30 of the first external connector 3 is greater than the clearance 16 between the rear portion 63 of the drop prevention wall 6 and the connection portions 21 of the first bus bars 2.

Setting the clearance 161 as above, during the insertion of the first external connector 3 into the case 4, it is difficult for the terminals 30 of the first external connector 3 to collide with the front portion 61 of the drop prevention wall 6. Consequently, the insertion can be made easily and smoothly without causing interference between the terminals 30 and the front portion 61.

In the present embodiment, as shown in FIGS. 19 and 20, the rear portion 63 of the drop prevention wall 6 has the substantially rectangular notches 67 formed in the first bus bars 3-side end of the rear portion 63.

Consequently, during assembly of the drop prevention member 69 and the first bus bars 3, the distal portions 24 of the first bus bars 3 can respectively pass through the notches 67, thereby preventing interference between the rear portion 63 of the drop prevention wall 6 and the first bus bars 3.

In particular, in the present embodiment, during assembly of the drop prevention member 69 and the first bus bars 3, the drop prevention member 69 can be moved toward the first bus bars 3 only in the X direction from the front side (i.e., the right side in FIG. 22). Moreover, referring to FIG. 25, the first bus bars 2 are bent upward to have the respective distal portions 24 extending obliquely with respect to the X direction. However, by providing the notches 67 in the rear portion 63 of the drop prevention wall 6, it is still possible to assemble the drop prevention member 69 and the first bus bars 3 without causing interference therebetween.

In the present embodiment, as shown in FIG. 23, the drop prevention wall 6 has the cut portion 68 formed therein for preventing interference with the tool 110 during manipulation of the tool 110 for tightening the bolt 619.

Consequently, it is possible to easily fix the integral piece of the drop prevention member 69, the terminal block 60, and the mount 620 to the frame 114 by tightening the bolt 619 with the tool 110, without causing interference between the tool 110 and the drop prevention wall 6.

In addition, with the cut portion 68, it is possible to form the fixing through-hole 610 in close vicinity to the drop prevention wall 6 while making it possible to reliably prevent interference between the drop prevention wall and the tool 110. As a result, the integral piece of the drop prevention member 69, the terminal block 60, and the mount 620 can be minimized.

Further, in the present embodiment, as shown in FIGS. 16-17, the case 4 includes the protrusion 45 that protrudes from the inner surface of the front wall 44 of the case 4 toward the fixing through-hole 610. The protrusion 45 is positioned to fill the cut portion 68 of the drop prevention wall 6.

Consequently, with the protrusion 45 filing the cut portion 68 of the drop prevention wall 6, it is possible to reliably prevent the bolts 5 from dropping outside the confinement space S.

In the present embodiment, the rim portion 480 of the ease 4 includes the lid-fixing parts 46 that are formed to protrude from the inner surface 410 of the top wall 41 of the case 4 toward the drop prevention member 69. On the other hand, the drop prevention wall 6 has the recessed portion 660 formed therein for preventing interference with the lid-fixing parts 46.

Consequently, as shown in FIG. 21, it is possible to prevent interference between the drop prevention wall 6 and the lid-fixing parts 46 of the rim portion 480 of the case 4 when the drop prevention member 69 is placed into the case 4 along with the frame 114.

Moreover, it is also possible to minimize the clearance 17 between the inner surface of the top wall 41 of the case 4 and the drop prevention wall 6, thereby more reliably preventing the bolts 5 from dropping outside the confinement space S.

Third Embodiment

Figure 27:
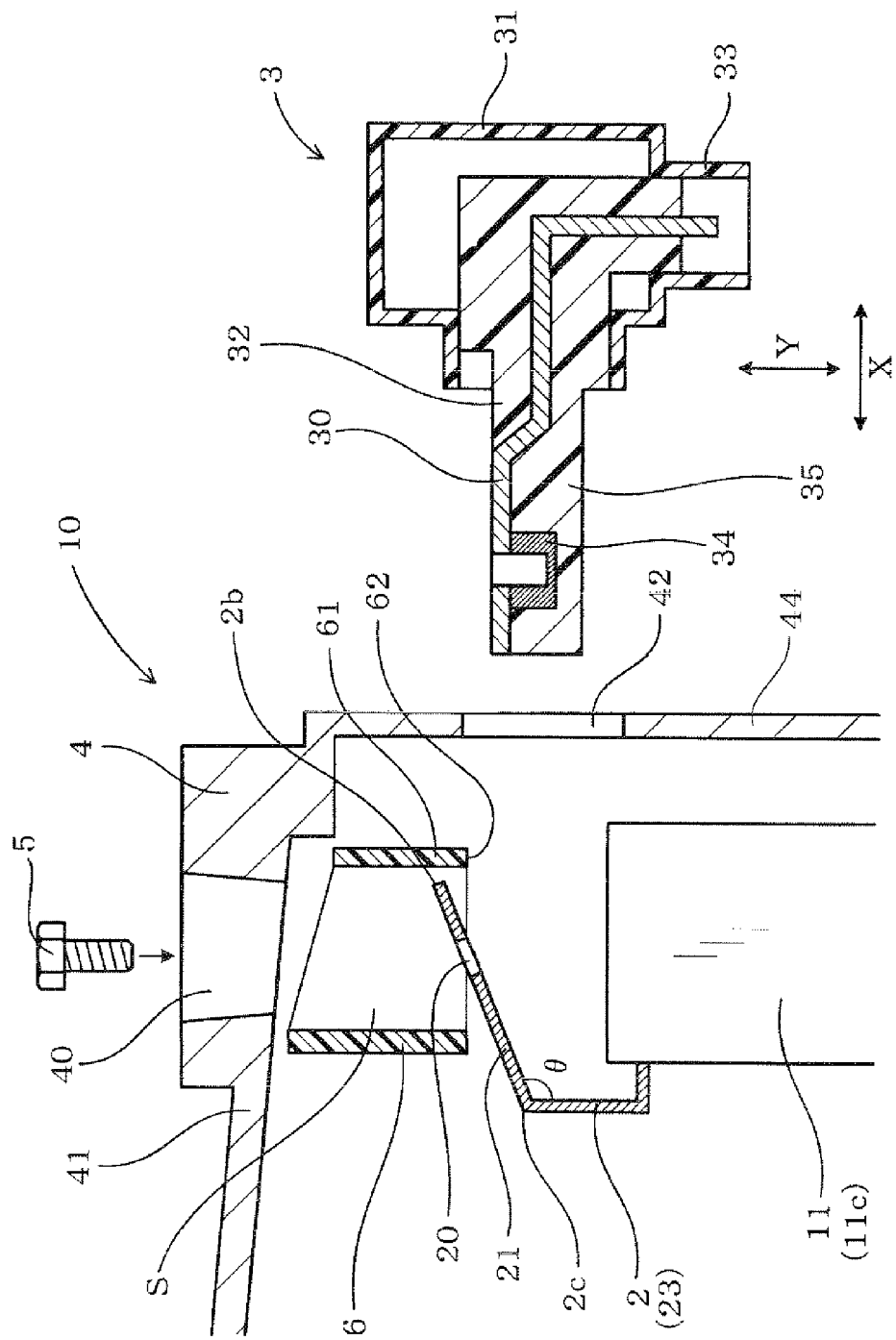
FIG. 27 is a partially cross-sectional view illustrating the configuration of an assembly according to the third embodiment of the invention, wherein the first external connector is not connected with the assembly.

In this embodiment, as shown in FIG. 27, none of the first bus bars 2 is bent in the connection portion 21 and thus they include no distal portion 24 as in the previous embodiments.

That is, in the present embodiment, each of the first bus bars 2 only includes the proximal portion 22, the intermediate portion 23, and the connection portion 21. The proximal portion 22 extends in the X direction from the capacitor 11 toward the opening 450 of the case 4 (i.e., leftward in FIG. 27). The intermediate portion 23 extends in the Y direction between the proximal portion 22 and the connection portion 21. The connection portion 21 extends obliquely with respect to the X direction from the intermediate portion 23 toward the confinement space S. Consequently, before being connected to the corresponding one of the terminals 30 of the first external connector 3, the connection portion 21 makes an obtuse angle θ with the intermediate portion 23. Moreover, when viewed from outside of the case 4 in the X direction through the opening 42 of the case 4, the distal end 2b of the connection portion 21 (i.e., the distal end 2b of the first connection bar 2) is located behind the front portion 61 of the drop prevention wall 6.

In the present embodiment, the first external connector 3 is connected to the assembly 10 in the following way.

Figure 28:
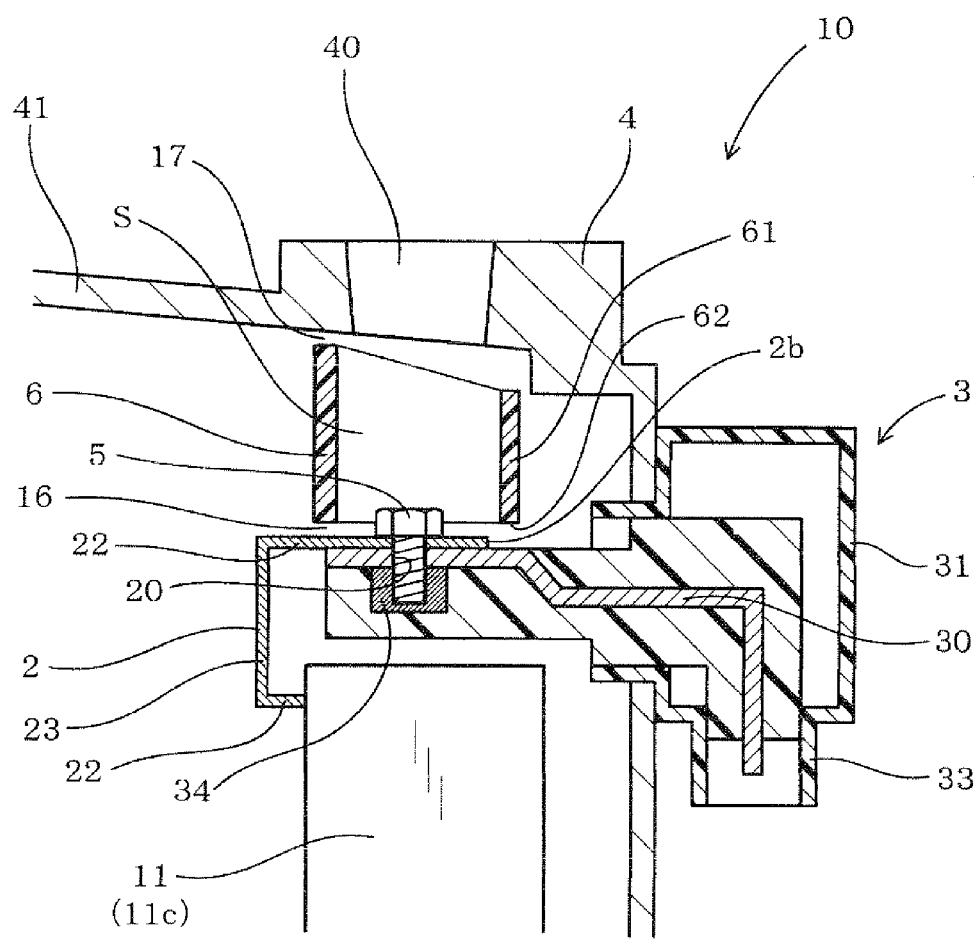
FIG. 28 is a partially cross-sectional view illustrating the configuration of the assembly according to the third embodiment, wherein the first external connector is connected with the assembly.

First, referring to FIGS. 27 and 28, the terminal seat portion 35 of the first external connector 3 is inserted into the case 4 through the opening 42 of the case 4. Then, each of the bolts 5 is placed inside the case 4 through the opening 40, inserted through the through-hole 20 of the connection portion 21 of the corresponding first bus bar 2 while pressing the connection portion 21 on the corresponding terminal 30 of the first external connector 3, and tightened into the corresponding nut 34 embedded in the terminal seat portion 35 of the first external connector 3. Consequently, the connection portions 21 of the first bus bars 2 are respectively connected to the terminals 30 of the first external connector 3 by the engagement between the corresponding pairs of the bolts 5 and the nuts 34.

According to the present embodiment, it is possible to achieve the following advantages.

In the present embodiment, the connection portions 21 of the first bus bars 2 extend straight without being bent to form the distal portions 24 as in the previous embodiments. Consequently, it becomes possible to increase the contact areas between the connection portions 21 of the first bus bars 2 and the terminals 30 of the first external connector 3. As a result, a larger electric current is allowed to flow between the first bus bars 2 and the terminals 30. In addition, the shape of the first bus bars 2 are simplified, thereby reducing the manufacturing cost.

Moreover, in the present embodiment, before insertion of the terminals 30 of the first external connector 3 into the case 4, when viewed along the insertion direction of the terminals 30 (i.e., in the X direction from the outside to the inside of the ease 4), the distal ends 2b of the first connection bars 2 are located behind the front portion 61 of the drop prevention wall 6.

With the above location of the distal ends 2b of the first bus bars 2, even if the terminals 30 of the first external connector 3 are incorrectly positioned to collide with the front portion 61 of the drop prevention wall 6 during the insertion thereof into the case 4, it is still possible to reliably prevent the distal ends 2b from being hit by the terminals 30 and thereby being undesirably deformed.

Fourth Embodiment

Figure 29:
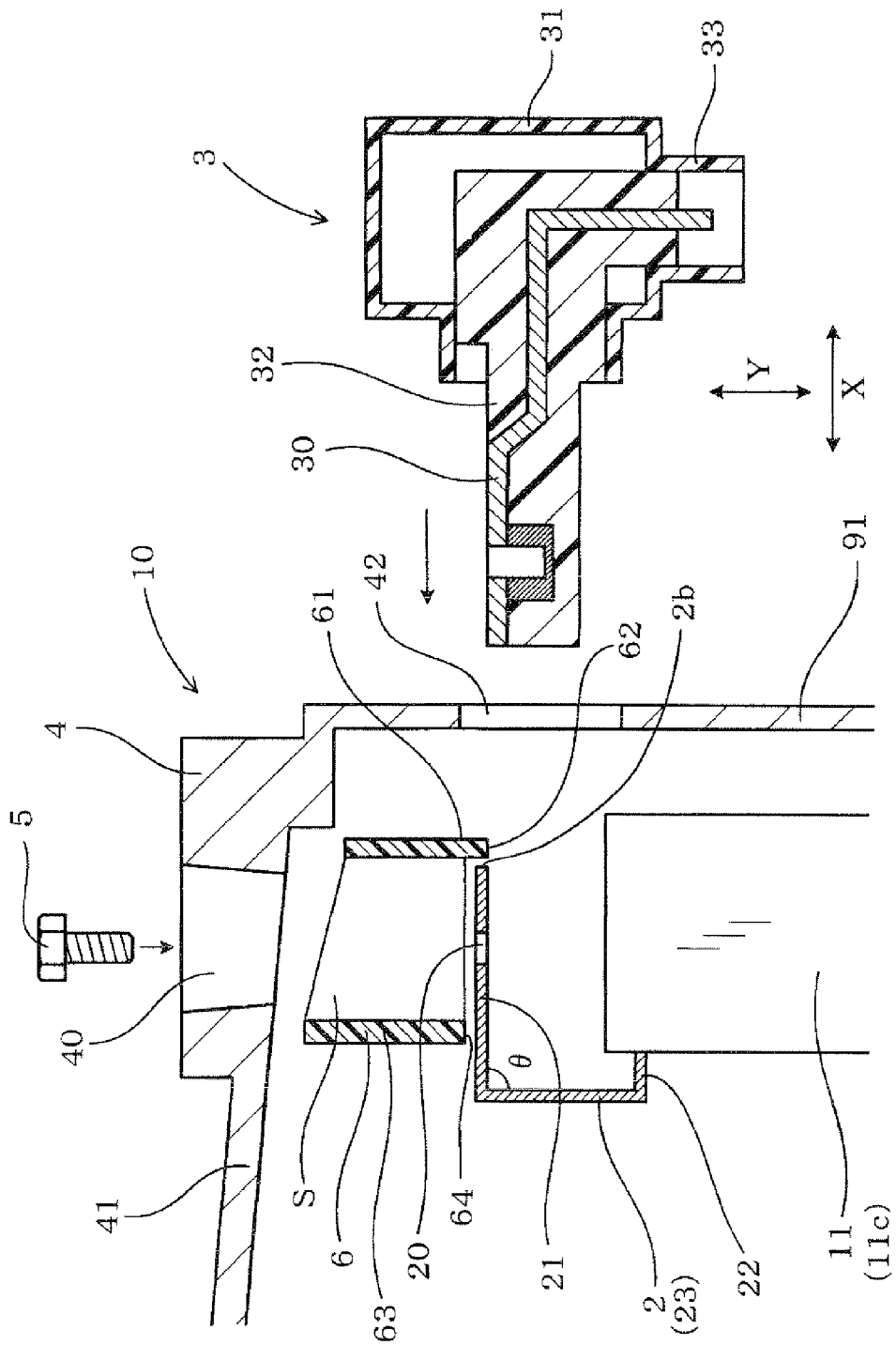
FIG. 29 is a partially cross-sectional view illustrating the configuration of an assembly according to the fourth embodiment of the invention, wherein the first external connector is not connected with the assembly.
Figure 30:
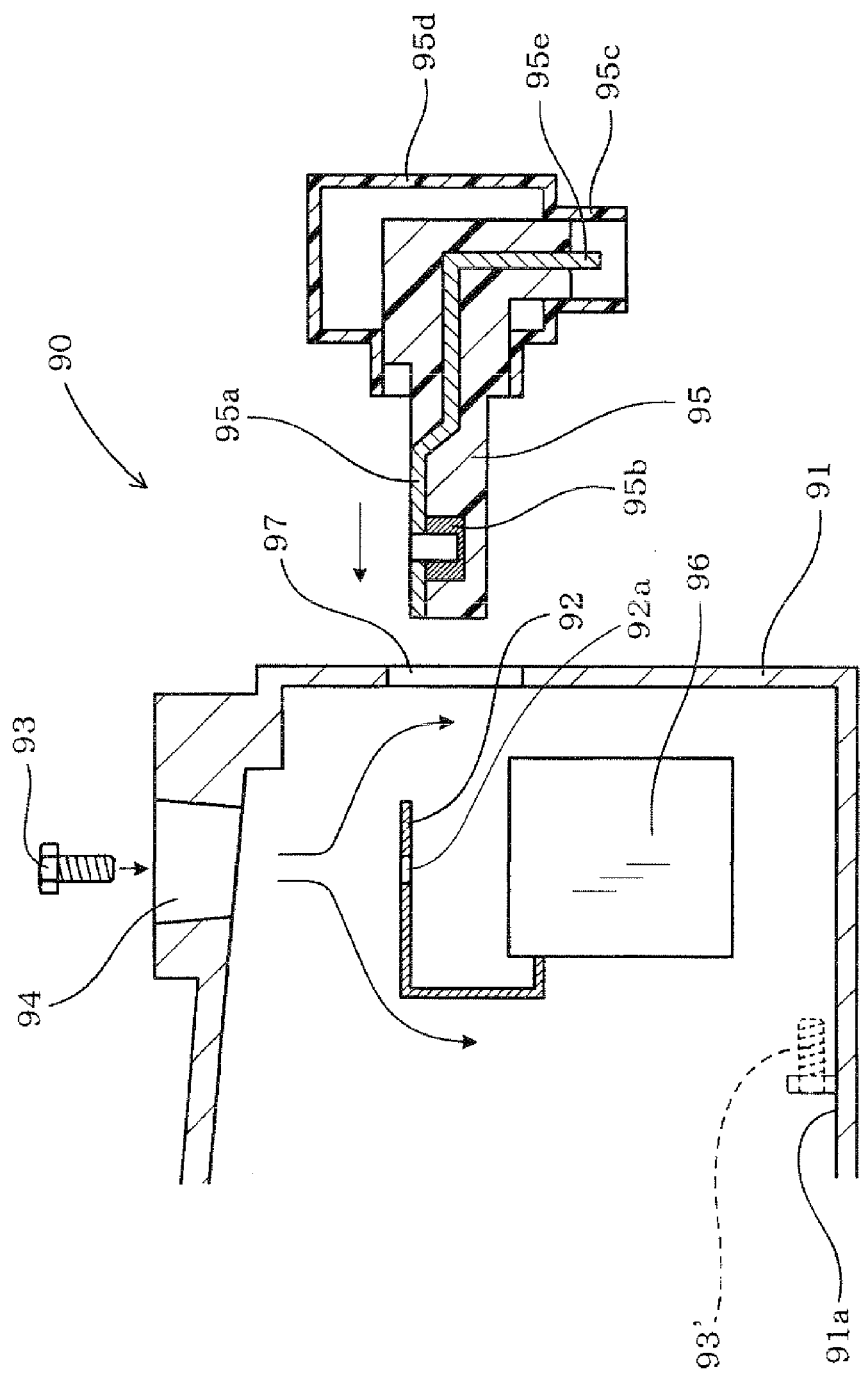
FIG. 30 is a partially cross-sectional view illustrating the configuration of a conventional assembly, wherein an external connector is not connected with the assembly.

In this embodiment, as shown in FIG. 29, the front portion 61 of the drop prevention wall 6 has its lower end 62 protruding from the lower end 64 of the rear portion 63 of the drop prevention wall 6 toward the capacitor 11c in the Y direction.

Moreover, as in the third embodiment, each of the first bus bars 2 is not bent in the connection portion 21 and thus includes no distal portion 24. That is, each of the first bus bars 2 only includes the proximal portion 22, the intermediate portion 23, and the connection portion 21.

However, unlike in the third embodiment, for each of the first bus bars 2 in the present embodiment, the connection portion 21 extends from the intermediate portion 23 in the X direction toward the front portion 61 of the drop prevention wall 6. That is, the angle θ between the connection portion 21 and the intermediate portion 23 is subsequently equal to 90°.

According to the present embodiment, it is possible to achieve the following advantages.

In the present embodiment, the connection portions 21 of the first bus bars 2 are configured to extend in the X direction, in other words, extend perpendicular to the Y direction.

With the above configuration, in connecting the connection portions 21 of the first bus bars 2 to the terminals 30 of the first external connector 3, the positions of the through-holes 20 formed in the connection portions 21 can be easily recognized from outside of the case 4 through the opening 40 of the case 4. Consequently, it is possible to easily insert the bolts 5 respectively through the through-holes 20 of the connection portions 21, thereby facilitating the connecting of the connection portions 21 to the terminals 30 of the first external connector 3.

In addition, when the connection portions 21 are configured to extend obliquely with respect to the X direction as in the third embodiment, the areas of the through-holes 20 of the connection portions 21 projected on a plane perpendicular to the Y direction are small and thus it may be difficult to recognize the positions of the through-holes 20 from outside of the case 4 through the opening 40. Consequently, it may be difficult to insert the bolts 5 respectively through the through-holes 20. Further, in this case, it may be possible to elongate the through-holes 20 so as to facilitate the recognition of the positions thereof. However, the elongation of the through-holes 20 will increase the electric resistances of the first bus bars 2.

In the present embodiment, the connection portions 21 of the first bus bars 2 extend straight without being bent to form the distal portions 24 as in the first embodiment.

With the above configuration, the contact areas between the connection portions 21 of the first bus bars 2 and the terminals 30 of the first external connector 3 are increased. As a result, a larger electric current is allowed to flow between the first bus bars 2 and the terminals 30. In addition, the shape of the first bus bars 2 are simplified, thereby reducing the manufacturing cost.

In the present embodiment, the drop prevention wall 6 is configured so that the lower end 62 of the front portion 61 protrudes from the lower end 64 of the rear portion 63 toward the capacitor 11c in the Y direction.

With the above configuration, when viewed along the insertion direction of the terminals 30 (i.e., in the X direction from the outside to the inside of the case 4), the distal ends 2b of the first connection bars 2 are positioned behind the front portion 61 of the drop prevention wall 6. Consequently, even if the terminals 30 of the first external connector 3 are incorrectly positioned to collide with the front portion 61 of the drop prevention wall 6 during the insertion thereof into the case 4, it is still possible to reliably prevent the distal ends 2b from being hit by the terminals 30 and thereby being undesirably deformed.

While the above particular embodiments of the invention have been shown and described, it will be understood by those skilled in the art that various modifications, changes, and improvements may be made without departing from the spirit of the invention.

What is claimed is:

1. An assembly comprising:
   at least one electronic component;
   a bus bar electrically connected to the at least one electronic component and having a connection portion; and
   a case that receives therein both the at least one electronic component and the bus bar,
   wherein
   the assembly is configured so as to allow the connection portion of the bus bar to be connected with a terminal of an external connector by engaging a first engaging member with a second engaging member within the case,
   the case has first and second walls and first and second openings that are formed respectively through the first and second walls,
   the first opening of the case opens in a thickness-wise direction of the connection portion of the bus bar,
   the first engaging member is to be placed inside the case through the first opening of the case,
   the second engaging member is provided in the external connector and to be placed inside the case along with the terminal through the second opening of the case,
   the assembly further comprises a drop prevention member interposed between the first wall of the case and the connection portion of the bus bar in the thickness-wise direction of the connection portion,
   the drop prevention member has a drop prevention wall and a through-hole that is defined by the drop prevention wall and aligned with the first opening of the case in the thickness-wise direction of the connection portion of the bus bar,
   the connection portion of the bus bar is positioned relative to the case and the drop prevention member so as to be viewable from outside of the case through both the first opening of the case and the through-hole of the drop prevention member,
   the assembly is further configured so that after the terminal of the external connector is inserted in the case through the second opening of the case, the drop prevention wall, the connection portion of the bus bar, and part of the external connector together define a confinement space within which the first engaging member is confined and thus prevented from dropping outside the confinement space during establishment of the engagement between the first and second engaging members,
   the drop prevention wall of the drop prevention member has a front portion that faces the second wall of the case and a second portion that faces the first portion with the through-hole of the drop prevention member formed therebetween, and after insertion of the terminal of the external connector into the case through the second opening of the case, a clearance between the front portion of the drop prevention wall and the terminal of the external connector is greater than a clearance between the rear portion of the drop prevention wall and the connection portion of the bus bar.

2. The assembly as set forth in claim 1, wherein the rear portion of the drop prevention wall has a substantially rectangular notch that is formed in a bus bar-side end of the rear portion for preventing interference between the drop prevention wall and the bus bar during assembly of the drop prevention member and the bus bar.

3. The assembly as set forth in claim 1, wherein the external connector has a terminal seat portion on which the terminal of the external connector is arranged, and the confinement space is defined by the drop prevention wall, the connection portion of the bus bar, and the terminal seat portion of the external connector.

4. The assembly as set forth in claim 1, wherein the bus bar is a first bus and the external connector is a first external connector, the assembly further comprises a second bus bar and a terminal block, the second bus bar being electrically connected to the at least one electronic component and having a connection portion, the terminal block having a mounting surface on which the connection portion of the second bus bar is to be connected with a terminal of a second external connector, and the terminal block is integrally formed with the drop prevention member into one piece.

5. The assembly as set forth in claim 1, wherein the first engaging member is a bolt that includes a head portion having a length in an axial direction of the bolt and a shaft portion, the second engaging member is a nut embedded in the external connector, the connection portion of the bus bar is to be connected with the terminal of the external connector by tightening the bolt into the nut, and both a clearance between the drop prevention wall and the bus bar and a clearance between the drop prevention wall and the external connector are set to be less than the length of the head portion of the bolt.

6. The assembly as set forth in claim 5, wherein a clearance between an inner surface of the first wall of the case and the drop prevention wall is set to be less than the length of the head portion of the bolt.

7. The assembly as set forth in claim 1, wherein the terminal of the external connector is to be inserted into the case through the second opening of the case so as to be located further from the first opening of the case than the connection portion of the bus bar is, the bus bar is bent toward the first wall of the case to have a distal portion that extends from the connection portion of the bus bar obliquely with respect to the connection portion, and the distal portion of the bus bar is located so that when viewed along an insertion direction of the terminal of the external connector, a distal end of the distal portion is positioned behind a front portion of the drop prevention wall which faces the second wall of the case.

8. The assembly as set forth in claim 1, further comprising a lid that is fixed to the case to close the first opening of the case, wherein the case further has a rim portion formed around the first opening of the case, the rim portion includes at least one lid-fixing part in which a tapped hole is formed for fixing the lid to the rim portion, the at least one lid-fixing part protrudes from an inner surface of the first wall of the case toward the drop prevention wall, and the drop prevention wall is configured to have a recessed portion for preventing interference with the at least one lid-fixing part of the rim portion of the case.

9. An assembly comprising:

at least one electronic component;

a bus bar electrically connected to the at least one electronic component and having a connection portion; and a case that receives therein both the at least one electronic component and the bus bar, wherein the assembly is configured so as to allow the connection portion of the bus bar to be connected with a terminal of an external connector by engaging a first engaging member with a second engaging member within the case, the case has first and second walls and first and second openings that are formed respectively through the first and second walls, the first opening of the case opens in a thickness-wise direction of the connection portion of the bus bar, the first engaging member is to be placed inside the case through the first opening of the case, the second engaging member is provided in the external connector and to be placed inside the case along with the terminal through the second opening of the case, the assembly further comprises a drop prevention member interposed between the first wall of the case and the connection portion of the bus bar in the thickness-wise direction of the connection portion, the drop prevention member has a drop prevention wall and a through-hole that is defined by the drop prevention wall and aligned with the first opening of the case in the thickness-wise direction of the connection portion of the bus bar, the connection portion of the bus bar is positioned relative to the case and the drop prevention member so as to be viewable from outside of the case through both the first opening of the case and the through-hole of the drop prevention member, and the assembly is further configured so that after the terminal of the external connector is inserted in the case through the second opening of the case, the drop prevention wall, the connection portion of the bus bar, and part of the external connector together define a confinement space within which the first engaging member is confined and thus prevented from dropping outside the confinement space during establishment of the engagement between the first and second engaging members, and further comprising a frame which is received in the case and to which the at least one electronic component is fixed, wherein the drop prevention member further has a fixing through-hole which is formed adjacent to the drop prevention wall and through which a bolt extends, the drop prevention member is fixed to the frame by tightening the bolt with a tool, a manipulation area, within which the tool is manipulated for tightening the bolt, partially overlaps the through-hole of the drop prevention member which is defined by the drop prevention wall, and the drop prevention wall is configured to have a cut portion for preventing interference with the tool during manipulation of the tool.

10. The assembly as set forth in claim 9, wherein the case further includes a protrusion that protrudes from an inner surface of the second wall of the case toward the fixing through-hole of the drop prevention member, and the protrusion of the case is positioned to fill the cut portion of the drop prevention wall.

11. The assembly as set forth in claim 9, wherein the external connector has a terminal seat portion on which the terminal of the external connector is arranged, and the confinement space is defined by the drop prevention wall, the connection portion of the bus bar, and the terminal seat portion of the external connector.

12. The assembly as set forth in claim 9, wherein the bus bar is a first bus and the external connector is a first external connector, the assembly further comprises a second bus bar and a terminal block, the second bus bar being electrically connected to the at least one electronic component and having a connection portion, the terminal block having a mounting surface on which the connection portion of the second bus bar is to be connected with a terminal of a second external connector, and the terminal block is integrally formed with the drop prevention member into one piece.

13. The assembly as set forth in claim 9, wherein the first engaging member is a bolt that includes a head portion having a length in an axial direction of the bolt and a shaft portion, the second engaging member is a nut embedded in the external connector, the connection portion of the bus bar is to be connected with the terminal of the external connector by tightening the bolt into the nut, and both a clearance between the drop prevention wall and the bus bar and a clearance between the drop prevention wall and the external connector are set to be less than the length of the head portion of the bolt.

14. The assembly as set forth in claim 13, wherein a clearance between an inner surface of the first wall of the case and the drop prevention wall is set to be less than the length of the head portion of the bolt.

15. The assembly as set forth in claim 9, wherein the terminal of the external connector is to be inserted into the case through the second opening of the case so as to be located further from the first opening of the case than the connection portion of the bus bar is, the bus bar is bent toward the first wall of the case to have a distal portion that extends from the connection portion of the bus bar obliquely with respect to the connection portion, and the distal portion of the bus bar is located so that when viewed along an insertion direction of the terminal of the external connector, a distal end of the distal portion is positioned behind a front portion of the drop prevention wall which faces the second wall of the case.

16. The assembly as set forth in claim 9, further comprising a lid that is fixed to the case to close the first opening of the case, wherein the case further has a rim portion formed around the first opening of the case, the rim portion includes at least one lid-fixing part in which a tapped hole is formed for fixing the lid to the rim portion, the at least one lid-fixing part protrudes from an inner surface of the first wall of the case toward the drop prevention wall, and the drop prevention wall is configured to have a recessed portion for preventing interference with the at least one lid-fixing part of the rim portion of the case.

* * * * *